United States Patent
Park et al.

(10) Patent No.: US 10,323,979 B2
(45) Date of Patent: Jun. 18, 2019

(54) ULTRAVIOLET MEASURING DEVICE, PHOTODETECTOR ELEMENT, ULTRAVIOLET DETECTOR, ULTRAVIOLET INDEX CALCULATION DEVICE, AND ELECTRONIC DEVICE INCLUDING SAME

(71) Applicant: SEOUL VIOSYS CO., LTD., Ansan-si (KR)

(72) Inventors: Ki Yon Park, Ansan-si (KR); Choong Min Lee, Ansan-si (KR); Hwa Mok Kim, Ansan-si (KR); Soo Hyun Lee, Ansan-si (KR); Gun Woo Han, Ansan-si (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 0 days.

(21) Appl. No.: 15/579,080

(22) PCT Filed: May 3, 2016

(86) PCT No.: PCT/KR2016/004648
§ 371 (c)(1),
(2) Date: Dec. 1, 2017

(87) PCT Pub. No.: WO2016/195253
PCT Pub. Date: Dec. 8, 2016

(65) Prior Publication Data
US 2018/0172506 A1    Jun. 21, 2018

(30) Foreign Application Priority Data

Jun. 1, 2015 (KR) .................. 10-2015-0077555
Jul. 31, 2015 (KR) .................. 10-2015-0109010
(Continued)

(51) Int. Cl.
*G01J 1/42* (2006.01)
*H01L 31/101* (2006.01)
(Continued)

(52) U.S. Cl.
CPC .............. *G01J 1/429* (2013.01); *G01J 1/42* (2013.01); *G01J 1/4228* (2013.01); *G01J 1/44* (2013.01);
(Continued)

(58) Field of Classification Search
CPC ........... H01L 31/02164; H01L 27/1203; H01L 31/02005; H01L 31/02019;
(Continued)

(56) References Cited

U.S. PATENT DOCUMENTS 4,801,998 A * 1/1989 Okuaki .................. G11C 16/18
257/681
6,104,074 A * 8/2000 Chen ..................... H01L 31/108
257/184
(Continued)

FOREIGN PATENT DOCUMENTS

EP          2568266 A1    3/2013
JP       H10318829 A    12/1998
(Continued)

OTHER PUBLICATIONS

International Search Report in International Application No. PCT/KR2016/004648, dated Aug. 17, 2016.
(Continued)

*Primary Examiner* — Kiho Kim
(74) *Attorney, Agent, or Firm* — Perkins Coie LLP

(57) ABSTRACT

Disclosed are an ultraviolet measuring device, a photodetector, an ultraviolet detector, an ultraviolet index calculation device, and an electronic device or portable terminal including the same. In one aspect, an ultraviolet measuring
(Continued)

is provided to comprise: a substrate on which an electrode is formed; a readout integrated circuit (ROTC) unit electrically connected with the electrode; and an aluminum gallium nitride (AlGaN) based UVB sensor electrically connected with the readout integrated circuit unit and formed on an insulating substrate, wherein the read-out integrated circuit converts a photocurrent input from the UV sensor into a digital signal including UV data.

43 Claims, 18 Drawing Sheets

(30) Foreign Application Priority Data

| | | |
|---|---|---|
| Mar. 9, 2016 | (KR) | 10-2016-0028453 |
| Mar. 25, 2016 | (KR) | 10-2016-0036267 |

(51) Int. Cl.

| | |
|---|---|
| *G01J 1/44* | (2006.01) |
| *G02B 6/32* | (2006.01) |
| *G02B 6/42* | (2006.01) |
| *G01R 19/165* | (2006.01) |
| *G01R 19/257* | (2006.01) |
| *H01L 25/16* | (2006.01) |
| *H01L 31/0203* | (2014.01) |
| *H01L 31/024* | (2014.01) |
| *H01L 27/144* | (2006.01) |
| *H01L 31/0304* | (2006.01) |
| *H01L 31/0392* | (2006.01) |
| *H01L 31/108* | (2006.01) |
| *H01L 23/60* | (2006.01) |
| *H01L 31/02* | (2006.01) |

(52) U.S. Cl.
CPC ......... *G01R 19/165* (2013.01); *G01R 19/257* (2013.01); *G02B 6/32* (2013.01); *G02B 6/42* (2013.01); *H01L 23/60* (2013.01); *H01L 25/167* (2013.01); *H01L 27/1443* (2013.01); *H01L 31/0203* (2013.01); *H01L 31/024* (2013.01); *H01L 31/02019* (2013.01); *H01L 31/03048* (2013.01); *H01L 31/0392* (2013.01); *H01L 31/101* (2013.01); *H01L 31/108* (2013.01); *H01L 31/1085* (2013.01); *G01J 2001/4413* (2013.01); *H01L 2224/48091* (2013.01); *H01L 2224/49107* (2013.01); *H01L 2924/16195* (2013.01); *Y02E 10/544* (2013.01)

(58) Field of Classification Search
CPC . H01L 2224/48091; H01L 2224/00014; H01L 2224/05554; H01L 23/60; H01L 25/042; H01L 25/167; H01L 27/1443; H01L 31/024; H01L 31/0203; H01L 31/03048; H01L 31/0392; H01L 31/108; H01L 31/1085; H01L 2224/49107; H01L 2924/16195; G01J 1/429; G01J 1/0407; G01J 1/42; G01J 1/4228; G01J 1/44; G01J 3/50; G01J 2001/4413; G01R 19/165; G01R 19/257; G02B 6/32; G02B 6/42; Y02E 10/544

See application file for complete search history.

(56) References Cited

U.S. PATENT DOCUMENTS

| | | | |
|---|---|---|---|
| 2003/0150998 A1* | 8/2003 | Shin | G01J 1/429 250/372 |
| 2004/0200975 A1 | 10/2004 | Brown et al. | |
| 2004/0218187 A1* | 11/2004 | Cole | G01B 11/272 356/454 |
| 2005/0236576 A1* | 10/2005 | Yagi | G01J 1/429 250/372 |
| 2006/0076502 A1 | 4/2006 | Boord et al. | |
| 2007/0241279 A1* | 10/2007 | Starikov | H01L 27/14618 250/338.4 |
| 2008/0157253 A1* | 7/2008 | Starikov | H01L 31/09 257/435 |
| 2008/0179503 A1* | 7/2008 | Camargo | H01L 31/0203 250/216 |
| 2008/0258155 A1* | 10/2008 | Chiba | H01L 31/02164 257/80 |
| 2010/0141601 A1 | 6/2010 | Kim et al. | |
| 2010/0276572 A1* | 11/2010 | Iwabuchi | H01L 23/481 250/208.1 |
| 2014/0192507 A1* | 7/2014 | Zablocki | H05K 9/0058 361/818 |
| 2015/0001410 A1 | 1/2015 | Yu et al. | |

FOREIGN PATENT DOCUMENTS

| | | |
|---|---|---|
| KR | 20020034311 A | 5/2002 |
| KR | 20040089582 A | 10/2004 |
| WO | 2008132622 A1 | 11/2008 |

OTHER PUBLICATIONS

Korean Official Action from related Korean Patent Application No. 10-2016-0028453 dated Aug. 31, 2017 (6 pages).
Korean Official Action from related Korean Patent Application No. 10-2016-0028453 dated Mar. 19, 2018 (6 pages).

* cited by examiner (a)  (b)

700

710  730  720

800

ULTRAVIOLET MEASURING DEVICE, PHOTODETECTOR ELEMENT, ULTRAVIOLET DETECTOR, ULTRAVIOLET INDEX CALCULATION DEVICE, AND ELECTRONIC DEVICE INCLUDING SAME

CROSS REFERENCE RELATED TO APPLICATIONS

This patent document is a 35 U.S.C § 371 National Stage application of PCT Application No. PCT/KR2016/004648, filed on May 3, 2016, which further claims benefits and priorities of Korean Patent Application No. 10-2015-0077555, filed on Jun. 1, 2015; Korean Patent Application No. 10-2015-0109010, filed on Jul. 31, 2015; Korean Patent Application No. 10-2016-0028453, filed on Mar. 9, 2016; and Korean Patent Application No. 10-2016-0036267, filed on Mar. 25, 2016. The entire disclosures of the above applications are incorporated by reference in their entirety as part of this document.

TECHNICAL FIELD

Exemplary embodiments of the present disclosure relate to an ultraviolet (UV) measurement device, a photodetector, a UV detector, a UV index calculation device, and an electronic device including the same.

BACKGROUND

A semiconductor photodetector is a semiconductor device configured to operate using a principle that electric current flows in response to application of light. In a semiconductor-based photodetector, a depletion region is generated by separation of holes and electrons in the semiconductor upon irradiation with light such that electric current flows therein due to the flow of electrons.

Generally, the photodetector is manufactured using a silicon semiconductor, a nitride semiconductor, and the like, all of which have energy band-gaps suitable for detection of light such as UV light. Such a photodetector can exhibit peak response at various wavelengths according to characteristics of the semiconductor. For example, a photodetector including a nitride semiconductor exhibits peak response at various wavelengths depending upon the composition ratio of constituent elements of a light absorption layer. Furthermore, in the nitride-based photodetector, a cut-off inclination of response according to wavelength differs depending upon the composition ratio of the constituent elements, and a decrease inclination of response according to decrease in wavelength also differs depending upon the composition ratio of the constituent elements.

Particularly, a semiconductor UV detection element can be applied to various fields including commerce, medicine, the military industry and communication, and thus is very important in such fields. Particularly, among GaN-based UV detection elements, Schottky junction type, metal-semiconductor-metal (MSM) type, and PIN type UV detection elements are generally used in the art. Although these GaN-based UV detection elements do not secure reproducibility and characteristics of a p-type AlGaN layer having a high Al content, the Schottky junction type UV detection element does not require growth of the p-AlGaN layer and thus is preferred due to a simple manufacturing process thereof. However, since the Schottky junction type UV detection element is based on Schottky characteristics between a semiconductor layer and a metal layer, the Schottky junction type UV detection element is more vulnerable to electrostatic discharge (ESD) than the PIN type UV light detection element.

In addition, in a UV detector in which an integrated circuit having a function of an analog-digital converter (ADC) is mounted on a housing and a UV detection element is bonded thereto, digital signals can be directly output from the housing. Here, since the integrated circuit is affected by UV light, visible light and infrared light, an output signal from the UV detector contains an output signal from the integrated circuit, thereby providing an inaccurate UV detection signal. This problem becomes apparent upon detection of UV light having a certain wavelength from sunlight.

On the other hand, UV light has a wavelength of 10 nm to 400 nm, which is shorter than the wavelength of a violet color, which has the shortest wavelength in the wavelengths of visible light, and has high energy to cause chemical reaction or a negative influence on human health. The UV light can be classified into many kinds depending upon wavelengths thereof and can be naturally obtained from sunlight or artificially obtained from a UV lamp and the like.

In sunlight, about 90% of UV light reaching the ground falls within the UVA wavelength band, and about 10% of the UV light falls within the UVB wavelength band. UV light in the UVC wavelength band is absorbed in the ozone layer and the atmosphere and substantially does not reach the ground. Artificial UV light is generated from UVA, UVB, and UVC lamps.

UVA light has a wavelength of 320 nm to 400 nm and is also referred to as life UV light to which persons are exposed in everyday life. The UVA light is encountered regardless of weather and reaches the dermal layer inside the skin to affect collagen and elastin acting to maintain skin elasticity, and pigment cells, thereby accelerating skin aging, such as generation of fine wrinkles, loss of skin elasticity, and generation of freckles through pigmentation.

UVB light has a wavelength of 280 nm to 320 nm and is also referred to as leisure UV light since UVB light causes sunburn on the skin to generate pain and inflammation thereon when a person is exposed to the sun on the beach or the like for a long time. UVB light provides beneficial effects such as synthesis of vitamin D, psoriasis treatment, and the like when a person is suitably exposed thereto, and can cause skin cancer or cataracts when a person is excessively exposed thereto.

UVC light has a wavelength of 200 nm to 280 nm and substantially does not reach the ground due to absorption in the atmosphere. However, UVC light is known to be very detrimental to the human body due to very high energy thereof. UVC light is broadly known as sterilization UV light.

The UV index is an index representing the intensity of UV light obtained by integrating the McKinlay-Diffey erythemal action spectrum curve, which indicates spectral irradiance of sunlight and the degree of damage to skin in the wavelength range of about 285 nm to about 385 nm, as a weighting function according to wavelength. The UV index indicates an influence of solar UV light on the skin.

As such, since UV light can be very detrimental to the human body depending upon the degree of exposure, with significant increasing concern on health, use of UV blocking agents increases in order to secure protection from UV light, and a technique of allowing a user to receive information regarding UV notice/alert through a personal digital assistant such as a mobile phone or a technique of allowing a user to measure the UV index in real time through a UV sensor mounted on the personal digital assistant is developed and distributed.

Actually, although a smart phone released in 2014 is provided with a UV sensor to provide information regarding the UV index, this smart phone is configured to display a UV range using a silicon-based sensor configured to detect visible light due to various reasons, such as manufacturing convenience and cost, and is known to fail to provide advantageous effects to users.

In order to display the UV index, it is necessary to detect and display the UVB wavelength band. However, since the silicon-based sensor is configured to estimate the UV index based on the intensity of visible light and part of the UVA wavelength band instead of directly detecting UV light in the UVB wavelength band, a UV index measurement device including such a silicon-based UV sensor provides a significant error between the measured UV index and an actual UV index. Moreover, although the UV index measurement device inevitably employs an expensive filter, use of the filter causes increase in manufacturing costs and such a filter still has a problem of incomplete blocking of visible light.

Moreover, although an application program of a smart phone can be used in the related art, the application program has low usability due to user inconvenience by requiring a user to execute the application program to detect UV light after installing the application program, and cannot automatically calculate the UV index, thereby making it difficult to obtain secondary information based on the UV index, such as UV risk degree, UV exposure time, UV exposure accumulation time, vitamin D synthesis time, and the like, in real time.

SUMMARY

Technical Problem

Exemplary embodiments of the present disclosure provide a UV measuring device, which includes an $Al_xGa_{(1-x)}N$ (0<x<1) based UV sensor configured to detect UV light according to wavelength, and a portable digital assistant including the same.

Exemplary embodiments of the present disclosure provide a photodetector capable of easily detecting a wavelength of incident light.

Exemplary embodiments of the present disclosure provide a photodetector capable of detecting light in a particular wavelength band even without using a filter.

Exemplary embodiments of the present disclosure provide a photodetector capable of detecting a wavelength of incident light using a single element.

Exemplary embodiments of the present disclosure provide an electronic device including the photodetector as described above.

Exemplary embodiments of the present disclosure provide a UV detector capable of detecting UV light with high accuracy and providing a digital output signal by preventing all fractions of light entering the UV detector from affecting an integrated circuit and contributing to an output of the UV detection element.

Exemplary embodiments of the present disclosure provide a UV detection element having improved resistance to electrostatic discharge (ESD).

Exemplary embodiments of the present disclosure provide a UV index calculation device capable of calculating a UV index through automatic detection of UV light even when a user does not operate the device.

Technical Solution

In accordance with one aspect of the present disclosure, a UV measuring device includes: a substrate having an electrode formed thereon; a read-out integrated circuit (ROIC) disposed inside the substrate and electrically connected to the electrode; and an aluminum gallium nitride (AlGaN) based UV sensor electrically connected to the read-out integrated circuit and formed on a growth substrate, wherein the read-out integrated circuit converts photocurrent input from the UV sensor into readable UV data. With this structure, the UVB sensor can be insulated from the read-out integrated circuit by the sapphire substrate and the like.

The UV measuring device may further include a transparent window formed of a transparent material and disposed on a surface of the substrate facing the UV sensor.

The UV sensor may be covered by a silicone material.

The UV sensor and the read-out integrated circuit may be bonded to each other to form an integrated structure.

The UV sensor may be mounted on a side surface of the read-out integrated circuit.

The UV sensor may be a UVB sensor.

Bonding between the UV sensor and the read-out integrated circuit may be achieved by a highly thermally conductive bonding agent.

Bonding between the UV sensor and the read-out integrated circuit may be achieved by an insulation bonding agent, and insulation between the UV sensor and the read-out integrated circuit may be achieved by the growth substrate.

The UV measuring device may further include a display unit displaying UV data generated using a signal processed by the read-out integrated circuit.

The transparent window may be formed of quartz.

The UV measuring device may further include an indium gallium nitride (InGaN) or gallium nitride (GaN) based UVA sensor, wherein the UVA sensor may be bonded to the read-out integrated circuit to have an integrated structure.

The UV measuring device may further include an aluminum gallium nitride (AlGaN) based UVC sensor, wherein the UVC sensor may be bonded to the read-out integrated circuit to have an integrated structure.

Data obtained through the UVA sensor or the UVC sensor may be used as supplemental data for improvement of accuracy in conversion of data obtained through the UVB sensor into UV data in the read-out integrated circuit.

The UV data may include at least one of UV quantity data, UV index data, vitamin D synthesis data, and safety/danger notice data.

The read-out integrated circuit may have a cavity formed in at least part of an upper region thereof that does not overlap the UV sensor.

In accordance with another aspect of the present disclosure, a portable digital assistant includes a power supply, a processor, a memory, and a display unit, and further includes the UV measuring device as described above, wherein the UV measuring device is exposed through one surface of the portable digital assistant and UV data generated using a signal processed by the read-out integrated circuit is displayed through the display unit.

In accordance with a further aspect of the present disclosure, a photodetector includes: a plurality of semiconductor photodetection chips exhibiting peak response at different wavelengths; a read-out integrated circuit (ROIC) determining current values generated from the plurality of semiconductor photodetection chips in response to incident light entering the plurality of semiconductor photodetection chips; and a memory unit storing wavelength response data of each of the plurality of semiconductor photodetection chips; and a processing unit matching the current values determined by the ROIC with the wavelength response data stored in the memory unit.

The processing unit may determine a wavelength of the incident light by matching the current values determined by the ROIC with the wavelength response data stored in the memory unit.

The photodetector may further include an output unit receiving wavelength data of the incident light determined by the processing unit and outputting the wavelength data.

The photodetector may further include a substrate on which the plurality of semiconductor photodetection chips is mounted.

The plurality of semiconductor photodetection chips may be separated at constant intervals from each other on the substrate.

The ROIC, the memory unit and the processing unit may be disposed inside the substrate.

The substrate may further include an output unit receiving wavelength data of the incident light determined by the processing unit and outputting the wavelength data.

The ROIC, memory unit and processing unit may be disposed outside the substrate.

The photodetector may further include a sidewall disposed on the substrate and surrounding side surfaces of the plurality of semiconductor photodetection chips.

The plurality of semiconductor photodetection chips may include first to ninth semiconductor photodetection chips separated from each other, and the first to ninth semiconductor photodetection chips may exhibit peak response with respect to light of first to ninth wavelengths, respectively.

The first to ninth wavelengths may be sequentially decreased from the first wavelength to the ninth wavelength by a constant value.

In accordance with yet another aspect of the present disclosure, a photodetector includes: a substrate; and a plurality of semiconductor photodetection chips disposed on the substrate and exhibiting peak response at different wavelengths, wherein the substrate may include a read-out integrated circuit (ROIC) determining current values generated from the plurality of semiconductor photodetection chips in response to incident light entering the plurality of semiconductor photodetection chips.

The photodetector may further include: a memory unit storing wavelength response data of each of the plurality of semiconductor photodetection chips; and a processing unit matching the current values determined by the ROIC with the wavelength response data stored in the memory unit, wherein the processing unit may determine a wavelength of the incident light by matching the current values determined by the ROIC with the wavelength response data stored in the memory unit.

In accordance with yet another aspect of the present disclosure, an electronic device includes any one of the photodetectors described above.

In accordance with yet another aspect of the present disclosure, there is provided an electronic device configured to detecting a wavelength of light entering a photodetector, wherein the photodetector includes a plurality of semiconductor photodetection chips exhibiting peak response at different wavelengths; a read-out integrated circuit (ROIC) determining current values generated from the plurality of semiconductor photodetection chips in response to incident light entering the plurality of semiconductor photodetection chips; a memory unit storing wavelength response data of each of the plurality of semiconductor photodetection chips; and a processing unit matching the current values determined by the ROIC with the wavelength response data stored in the memory unit.

The processing unit may determine a wavelength of the incident light by matching the current values determined by the ROIC with the wavelength response data stored in the memory unit.

The electronic device may further include an output unit receiving wavelength data of the incident light determined by the processing unit and outputting the wavelength data.

The electronic device may further include a display unit displaying the wavelength data output from the output unit.

In accordance with yet another aspect of the present disclosure, a UV detector includes: a gallium nitride-based UV detection element including at least one electrode; a silicon (Si) based integrated circuit including at least one pad electrically connected to the electrode to process an output signal from the UV detection element; a light blocking layer formed on one side of the integrated circuit and shielding a photoreactive region of the integrated circuit; and a housing receiving the integrated circuit having the UV detection element mounted thereon and including a plurality of electrodes so as to be electrically connected to the pad of the integrated circuit.

According to exemplary embodiments, the UV detection element may be formed on a sapphire substrate for insulation from the integrated circuit and bonded to an upper surface of the integrated circuit.

According to exemplary embodiments, the light blocking layer may include a plurality of metal layers.

According to exemplary embodiments, the plurality of metal layers may be disposed at different locations such that each metal layer is displaced from another metal layer disposed at an upper or lower side thereof.

According to exemplary embodiments, the light blocking layer may further include an insulation layer interposed between the plural metal layers.

According to exemplary embodiments, the light blocking layer may be further disposed in an analog digital converter (ADC) block region converting an analog signal output from the UV detection element into a digital signal, a pad periphery region electrically connected to the electrode of the UV detection element and the electrodes of the housing, and a sealing region formed along a periphery of the integrated circuit.

According to exemplary embodiments, the UV detector may further include a ground pad for prevention of electrostatic discharge disposed inside the integrated circuit.

According to exemplary embodiments, the housing may include a window formed of a transparent material and disposed on a surface thereof facing the UV detection element.

According to exemplary embodiments, the window may be formed of quartz.

According to exemplary embodiments, the housing may be filled with a filler.

According to exemplary embodiments, the filler may be formed of a transparent silicone material allowing transmission of UV light therethrough.

In accordance with yet another aspect of the present disclosure, a UV index calculation device includes: an irradiance sensor generating an irradiance signal through detection of irradiance; a UV sensor generating a UV signal through detection of UV light; and a controller driving the UV sensor and calculating a UV index in response to the UV signal sent from the UV sensor when the irradiance detected by the irradiance sensor is a predetermined irradiance or more.

Advantageous Effects

Exemplary embodiments of the present disclosure provide a UV measuring device, which significantly improves measurement accuracy of UV light in a broad wavelength band through application of a UV sensor based on indium gallium nitride (InGaN) or aluminum gallium nitride (AlGaN) instead of silicon (Si), and a portable digital assistant including the same.

Particularly, the UV measuring device has advantages such as process simplification and reduction in manufacturing costs through formation of a package in which the UV sensor is efficiently coupled to a read-out integrated circuit (ROIC).

In addition, exemplary embodiments of the present disclosure provide a universal photodetector that can be used regardless of wavelengths of incident light by eliminating a filter and a need for selection of different photodetectors depending upon usage thereof. The universal photodetector may be applied to various electronic devices.

Further, according to exemplary embodiments, the UV detection element is bonded to an integrated circuit disposed inside a housing and a light blocking layer is further formed on the integrated circuit to prevent the integrated circuit from being affected by light entering the UV detection element such that a photo signal can be output only as a signal processed by the UV detection element, thereby improving detection accuracy.

Further, according to exemplary embodiments, the integrated circuit is provided with a separate ground pad for protection from electrostatic discharge so as to prevent a ground electrode of the UV detection element from being directly connected to a ground electrode of the housing, thereby improving electrostatic discharge protection of the UV detection element.

Further, exemplary embodiments provide a UV index calculation device that selectively calculates the UV index through cooperation between a UV sensor and an irradiance sensor when a predetermined irradiance or more is detected. Particularly, since the UV sensor is driven in association with the irradiance sensor, data according to the UV index can be automatically provided to a user without implementing a separate application program.

DETAILED DESCRIPTION

Figure 1:
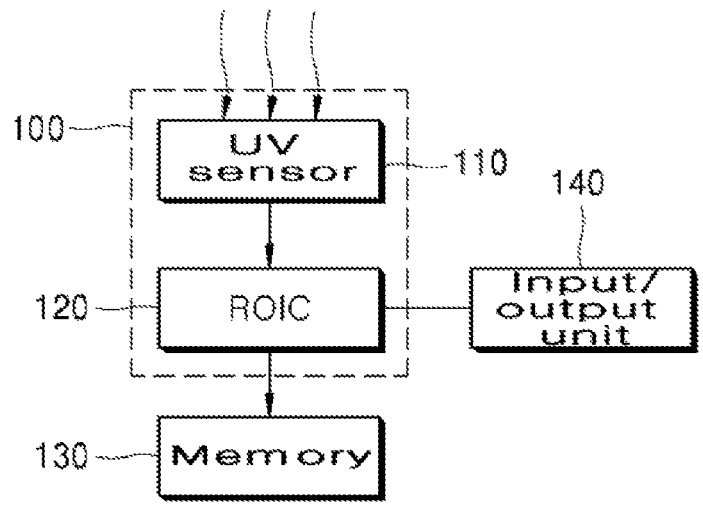
FIG. 1 is a block diagram of a UV measuring device according to one exemplary embodiment of the present disclosure.

The present disclosure is not limited to exemplary embodiments disclosed herein and can also be implemented in different forms. Descriptions of details apparent to those skilled in the art are omitted for clarity, and like reference numerals denote like elements having the same or similar functions throughout the specification.

When an element is referred to as being "connected to" another element throughout the specification, it can be directly connected to the other element or can be indirectly connected thereto via intervening elements therebetween. The terms "comprises," "comprising," "includes," and "having," are inclusive and do not preclude the presence or addition of other elements unless stated otherwise.

Next, exemplary embodiments of the present disclosure will be described in detail with reference to the accompanying drawings. It should be noted that compositions, growth methods, growth conditions, and thicknesses of semiconductor layers described below are provided for illustration only and do not limit the scope of inventive technologies disclosed herein. For example, a composition ratio of Al and Ga in AlGaN may be applied in various ways as needed. Furthermore, semiconductor layers described below can be grown by various methods well-known to a person having ordinary knowledge in the art (hereinafter, "those skilled in the art"), for example, metal organic chemical vapor deposition (MOCVD), molecular beam epitaxy (MBE), hydride vapor phase epitaxy (HVPE), and the like. Here, in the following exemplary embodiments, semiconductor layers will be illustrated as being grown in the same chamber by MOCVD and source gases supplied into the chamber may be typical source gases known to those skilled in the art and selected depending upon composition ratio, without being limited thereto.

Figure 2A:
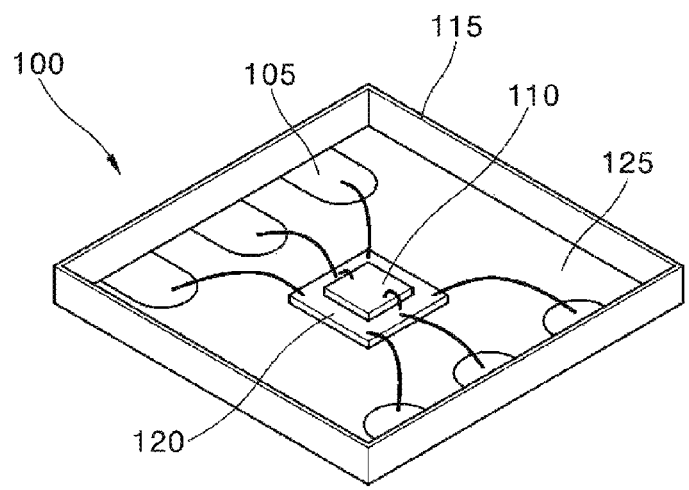
FIG. 2A and FIG. 2B are a perspective view and a side view of a UV sensor package of the UV measuring device shown in FIG. 1, respectively.
Figure 2B:
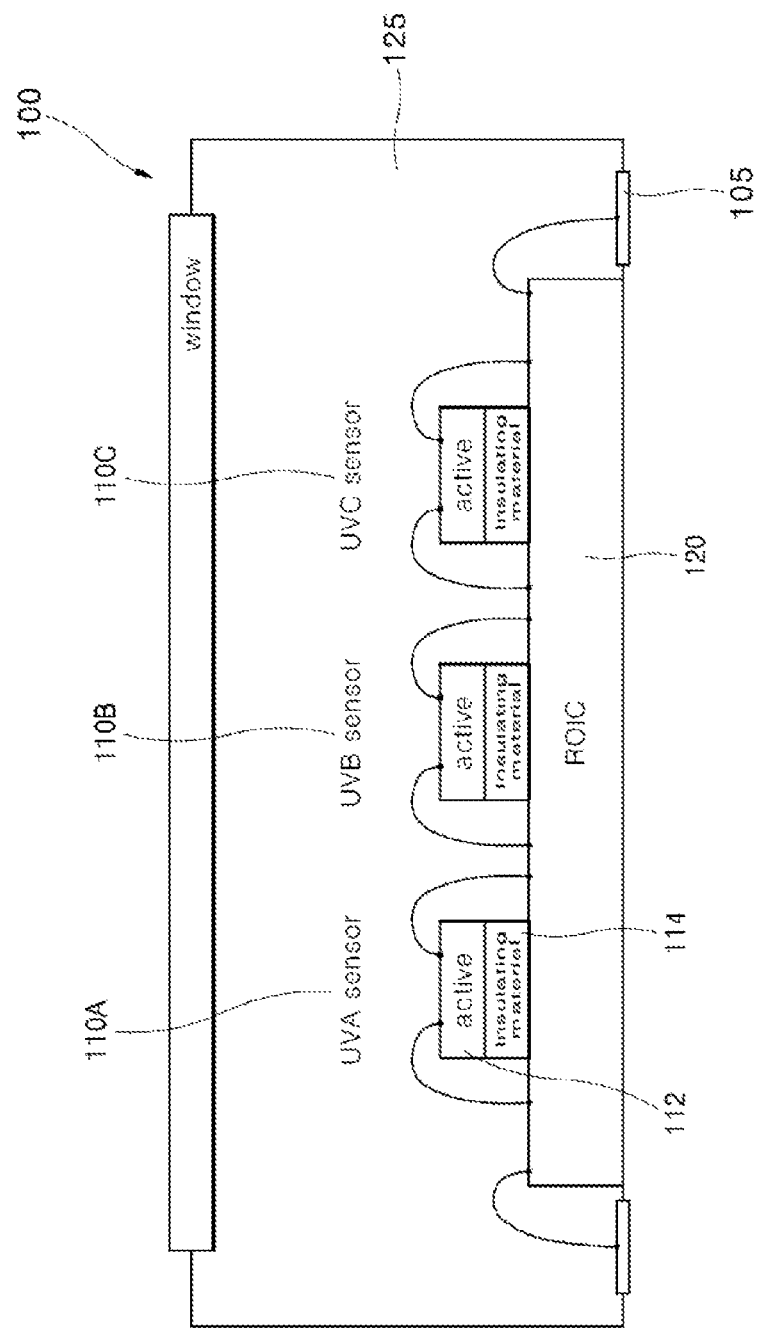

FIG. 1 is a block diagram of a UV measuring device according to one exemplary embodiment of the present disclosure, and FIG. 2A and FIG. 2B are a perspective view and a side view of a UV sensor package of the UV measuring device shown in FIG. 1, respectively.

Referring to FIG. 1, the UV measuring device according to one exemplary embodiment includes a UV sensor 110, a read-out integrated circuit 120, a memory 130, and an input/output unit 140.

The UV sensor 110 serves to detect a UV component after directly receiving light from the outside, and can be classified into a UVA sensor, a UVB sensor and a UVC sensor depending upon wavelengths of detectable UV light.

The UV sensor 110 may be manufactured by a technique disclosed in a patent of the applicant (Korean Patent Laid-open Publication No. 10-2014-086674 (Title of the Invention: Photodetector element), Korean Patent Laid-open Publication No.10-2014-086617 (Title of the Invention: Photodetector element), Korean Patent Laid-open Publication No.10-2014-092583 (Title of the Invention: Photodetector element), Korean Patent Laid-open Publication No. 10-2014-094080 (Title of the Invention: Photodetector and light detection package including the same), and the like, without being limited thereto.

The read-out integrated circuit (ROIC) 120 serves to process a UV signal received from the UV sensor 110.

Herein, the read-out integrated circuit refers to a circuit for converting an input signal into a digital signal, particularly a digital signal suitable for image signal processing. Generally, the read-out integrated circuit has functions, such as an amplification function, a noise removal function and a cell selection function, and is configured to provide low power consumption, low noise, linearity, unity, good frequency response, and the like.

Accordingly, the read-out integrated circuit 120 applied to the UV measuring device according to the exemplary embodiments may process the signal detected by the UV sensor 110 such that the signal can be directly supplied to the input/output unit 140, or such that supplemental data can be generated in various forms using the signal.

In this process, the UV measuring device according to the exemplary embodiment may be configured to use a separate processor or the memory 130. Furthermore, the UV measuring device may include an input unit 140 in order to allow a user to select desired data among various UV data, which can be generated using the UV signal processed by the read-out integrated circuit 120.

Although the input unit and the output unit are illustrated as a single input/output unit 140 in the exemplary embodiment of FIG. 1, this structure is not limited to a component such as a screentouch type input/output device, which is configured to provide an input function and an output function at the same time.

In the UV measuring device according to the exemplary embodiment, the UV sensor 110 may be an aluminum gallium nitride (AlGaN) UVB sensor.

As described above, UVB light has a wavelength of 280 nm to 320 nm, can provide beneficial effects such as synthesis of vitamin D and the like when a person is suitably exposed to the UVB light, and can cause skin cancer or cataracts when a person is excessively exposed thereto. Since such UVB light provides the greatest influence on human life in a natural light state, the UV measuring device according to the exemplary embodiment can provide UV quantity data (mW/cm$^2$) or UV index data obtained through conversion of the UV quantity data after direct detection of UVB light. Furthermore, the UV measuring device according to the exemplary embodiment may also be configured to provide time data required for synthesis of suitable amounts of vitamin D under current UV conditions, notice alarm, and the like.

In the UV measuring device according to this exemplary embodiment, the UVB sensor 110 may be bonded to an upper surface of the read-out integrated circuit 120 to have an integrated structure, or to have a package structure disposed inside a separate casing (not shown). In this structure, a surface of the casing facing the UVB sensor 110, that is, a light incidence surface of the UV sensor 110, may be provided with a transparent window allowing transmission of UV light therethrough to protect circuits inside the sensor.

Details of a UV sensor/ROIC package 100 formed by bonding the UV sensor 110 to the read-out integrated circuit 120 will now be described in detail with reference to FIG. 2A and FIG. 2B.

First, referring to FIG. 2A, in the UV measuring device according to this exemplary embodiment, the package 100 of the UV sensor 110 and the read-out integrated circuit 120 may be formed inside the casing having a plurality of electrodes 105 formed thereon.

Here, an $In_xGa_{1-x}N$ (0<x1) or $Al_xGa_{(1-x)}N$ (0<x<1) based element constituting the UV sensor 110 may be formed on an insulating substrate such as a sapphire substrate or a silicon carbide (SiC) substrate. The UV sensor 110 may be insulated from the read-out integrated circuit 120 by the insulating substrate. Accordingly, the UV measuring device according to this exemplary embodiment does not require a process of forming a separate insulation layer upon bonding of the UV sensor 110 to the read-out integrated circuit 120 for formation of the UV sensor/ROIC package 100. For reference, in description of this exemplary embodiment, the UV sensor 110 may be illustrated as being formed on the sapphire substrate. However, it should be understood that other implementations are also possible. Alternatively, the UV sensor may also be formed on any typical insulating substrate, such as a sapphire substrate, a SiC substrate, and the like.

In other words, since the UV sensor 110 employs an insulating material such as a sapphire substrate at a lower side thereof, the UV sensor 110 can be directly bonded to the upper surface of the read-out integrated circuit 120 without forming a separate insulation layer, thereby achieving process simplification while reducing manufacturing costs. Specifically, the UV sensor 110 and the read-out integrated circuit 120 are individually manufactured and are then bonded to each other through a simple bonding process, thereby reducing losses due to generation of defects unlike an integral type package formed through a semiconductor process. On the other hand, the UV measuring device according to the exemplary embodiment can provide advantages such as process simplification and reduction in manufacturing costs through elimination of the process of forming an insulation layer for stable bonding between individual elements. Here, bonding between the UV sensor 110 and the read-out integrated circuit 120 may be achieved by any typical methods. In this exemplary embodiment, bonding between the UV sensor 110 and the read-out integrated circuit 120 may be achieved using a bonding agent, such as a silver paste, which exhibits electrical conductivity and high thermal conductivity.

The surface of the casing facing the UV sensor 110 may be provided with a transparent window 115 that allows transmission of UV light therethrough. Thus, in order to secure transmission of UV light while protecting interior circuits of the UV sensor 110, the transparent window 115 may be formed of quartz or the casing may be filled with a filler 125 such as a silicone material.

For reference, the filler 125 formed of the silicone material has a drawback of causing inaccurate measurement due to a yellowing phenomenon upon irradiation with intense UV light exceeding the range of natural light or upon exposure to UVC that is substantially not present in natural light. Therefore, if the UV measuring device is not applied to daily supplies exposed to natural light, the UV measuring device may be provided with the transparent window 115 formed of quartz.

Preferably, in the UV measuring device according to the exemplary embodiment, the UV sensor 110 is a UVB sensor. However, it should be understood that other implementations are also possible. For example, the UV sensor 110 may be a UVB sensor, a combination of UVA sensor and a UVB sensor, a combination of a UVB sensor and a UVC sensor, a combination of a UVA sensor, a UVB sensor, and a UVC sensor, or the like.

FIG. 2B shows one example of the UV measuring device including the combination of a UVA sensor, a UVB sensor, and a UVC sensor. Referring to FIG. 2B, in the UV measuring device according to the exemplary embodiment, the UV sensor/ROIC package 100 includes a UVA sensor 110A, a UVB sensor 110B and a UVC sensor 110C bonded to the upper surface of the read-out integrated circuit 120, and the casing including the electrodes 105 and the transparent window 115.

In this exemplary embodiment, the $In_xGa_{1-x}N$ (0<x1) or the $Al_xGa_{(1-x)}N$ (0<x<1) based element constituting each of the UV sensors 110A, 110B, 110C includes an insulation material layer 114 such as a sapphire substrate and an active layer 112 formed on the insulation material layer 114. With this structure, the UV sensors 110A, 110B, 110C may be directly bonded to the read-out integrated circuit 120 using such an insulation material layer 114 without a process of forming a separate insulation layer.

The UVA sensor 110A serves to detect UVA light having a wavelength of 315 nm to 400 nm and may be realized by a photosensor based on $In_xGa_{1-x}N$ (0<x1). In addition, the UVB sensor 110B and the UVC sensor 110C serve to detect UVB light having a wavelength of 280 nm to 315 nm and UVC light having a wavelength of 100 nm to 280 nm, respectively, and may be realized by AlGaN-based photosensors. Here, the AlGaN material for the UVB sensor 110B may have an Al content of about 20% and the AlGaN material for the UVC sensor 110C may have an Al content of about 40%.

Such UV sensors 110A, 110B, 110C may be manufactured by a technique disclosed in a patent of the applicant (Korean Patent Laid-open Publication No. 10-2014-086674 (Title of the Invention: Photodetector), Korean Patent Laid-open Publication No.10-2014-086617 (Title of the Invention: Photodetector), Korean Patent Laid-open Publication No. 10-2014-092583 (Title of the Invention: Photodetector), Korean Patent Laid-open Publication No. 10-2014-094080 (Title of the Invention: Photodetector and light detection package including the same), and the like, without being limited thereto.

Referring to FIG. 2A and FIG. 2B, the electrodes 105 formed on the bottom of the casing are electrically connected to the read-out integrated circuit 120, which is also electrically connected to each of the UV sensors 110A, 110B, 110C. However, it should be understood that other implementations are also possible and electrical connection between elements in the UV measuring device according to the exemplary embodiment can also be realized by other typical configurations.

The UV measuring device according to the exemplary embodiment described above can provide accurate UV data to a user based on detection data according to wavelength detected by the UV sensors corresponding to each wavelength.

That is, unlike a silicon-based UV sensor, the UV sensors of the UV measuring device according to the exemplary embodiment provides various data with high accuracy, such as UV quantity data (mW/cm$^2$), UV index data, UV On/Off data, vitamin D synthesis data based on the UVB index, safety/danger notice data according to the UVA, UVB and UVC indexes, and the like through individual detection of UVA, UVB and UVC.

Furthermore, the UV measuring device according to the exemplary embodiment can generate the safety notice data or the danger notice data using UV data according to wavelength obtained through each of the corresponding UV sensors. Accordingly, the UV measuring device according to the exemplary embodiment can provide time data for a user to be kept in a stable state or danger data alerting a user that the user is in an unsafe state by comprehensively taking into account the UV quantity and the UV exposure time according to wavelength. Particularly, the UV measuring device according to the exemplary embodiment or a portable digital assistant including the same may be provided with separate sensors with respect to two or more wavelength bands. With this structure, the UV measuring device may be configured to use detection data of the other sensors in order to improve accuracy of detection results provided by each of the sensors. This structure will be described in more detail below with reference to FIG. 4 to FIG. 6.

Here, the safety or danger notice data may be classified into several stages and displayed in different forms corresponding to the stages, for example, different alarm sounds or different display colors.

In addition, it should be noted that the UV data provided by the UV measuring device according to the exemplary embodiment are not limited to the UV quantity data, the UV index data, the vitamin D synthesis data, and the safety/danger notice data described above and the UV measuring device according to the exemplary embodiment may provide any information that can be processed or generated using the UV data detected by each of the UV sensors.

On the other hand, although the UV measuring device according to the exemplary embodiment can be provided as a separate device, the UV measuring device according to the exemplary embodiment may also be mounted on a personal digital assistant such as a smartphone. Accordingly, exemplary embodiments of the present disclosure can provide a personal digital assistant including the UV measuring device according to the exemplary embodiment.

Specifically, the UV measuring device is mounted on one surface of the portable digital assistant, such as a smartphone, which includes a power supply, a processor, a memory, and a display unit, such that the transparent window 115 of the UV sensor package constituting the UV measuring device can be exposed. With this structure, the UV measuring device allows users to conveniently measure the UV index in real time and to use various data based on the UV index. In this case, the UV measuring device may be configured to use an output unit or an input unit provided to the portable digital assistant instead of including a separate output unit or input unit.

Here, the UV measuring device mounted on the portable digital assistant according to the exemplary embodiment includes a package formed by bonding the UV sensor to the read-out integrated circuit. In addition, the UV sensor may be a GaN, InGaN or AlGaN-based sensor formed on a sapphire substrate.

Figure 3A:
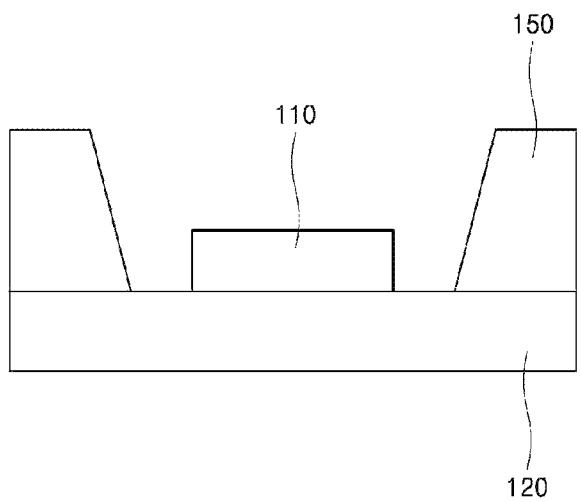
FIG. 3A to FIG. 3C are sectional views of examples of the UV sensor package shown in FIG. 1.
Figure 3B:
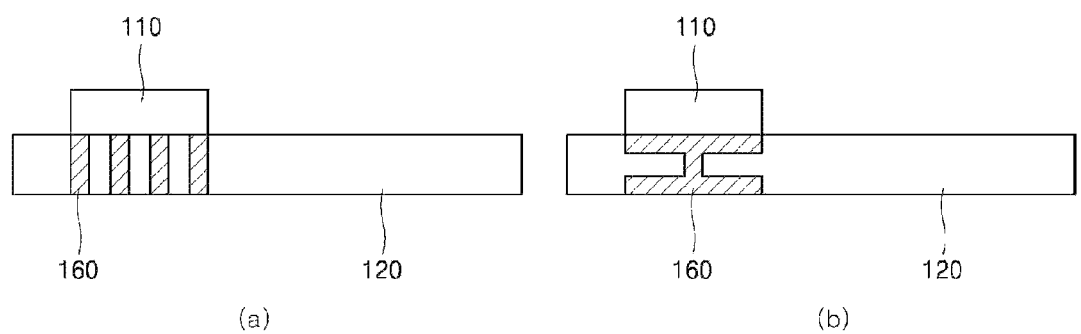
Figure 3C:
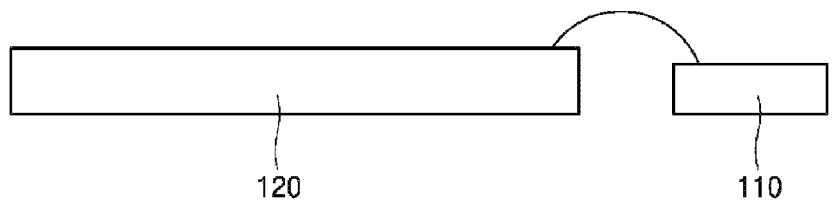

FIG. 3A to FIG. 3C are sectional views of examples of the UV sensor package shown in FIG. 1.

Referring to FIG. 3A, a cavity 150 is formed in at least part of an upper region of the read-out integrated circuit 120 that does not overlap the UV sensor 110.

With this structure, the UV sensor package can have a relatively light weight and a small size through reduction in space area.

Referring to FIG. 3B, a heat pipe 160 is disposed in the read-out integrated circuit 120 under the UV sensor 110, thereby enabling more efficient discharge of heat from the UV sensor 110.

The heat pipe 160 may be formed of a material having relatively high thermal conductivity. Further, the heat pipe 160 according to this exemplary embodiment may also include any highly thermally conductive material, without being limited thereto. On the other hand, FIG. 3C shows one example of the UV package in which the UV sensor 110 is separated from the read-out integrated circuit 120 or contacts a side surface thereof while maintaining electrical connection therebetween, instead of being bonded to the upper side thereof.

In this example, even without a separate component such as the heat pipe as shown in FIG. 3B, the UV sensor package allows direct discharge of heat through a module, thereby preventing a problem caused by heat generation while reducing the height thereof.

Figure 4:
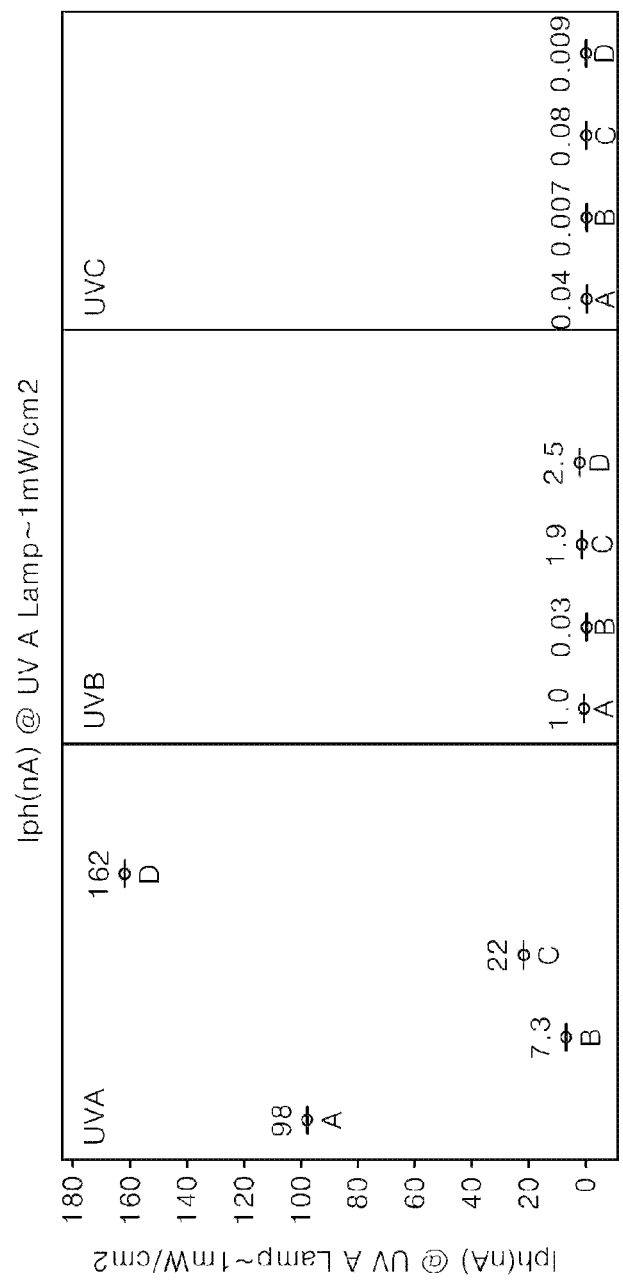
FIG. 4 to FIG. 6 are graphs depicting UV index measurement results obtained using various UVA, UVB and UVC sensors.
Figure 5:
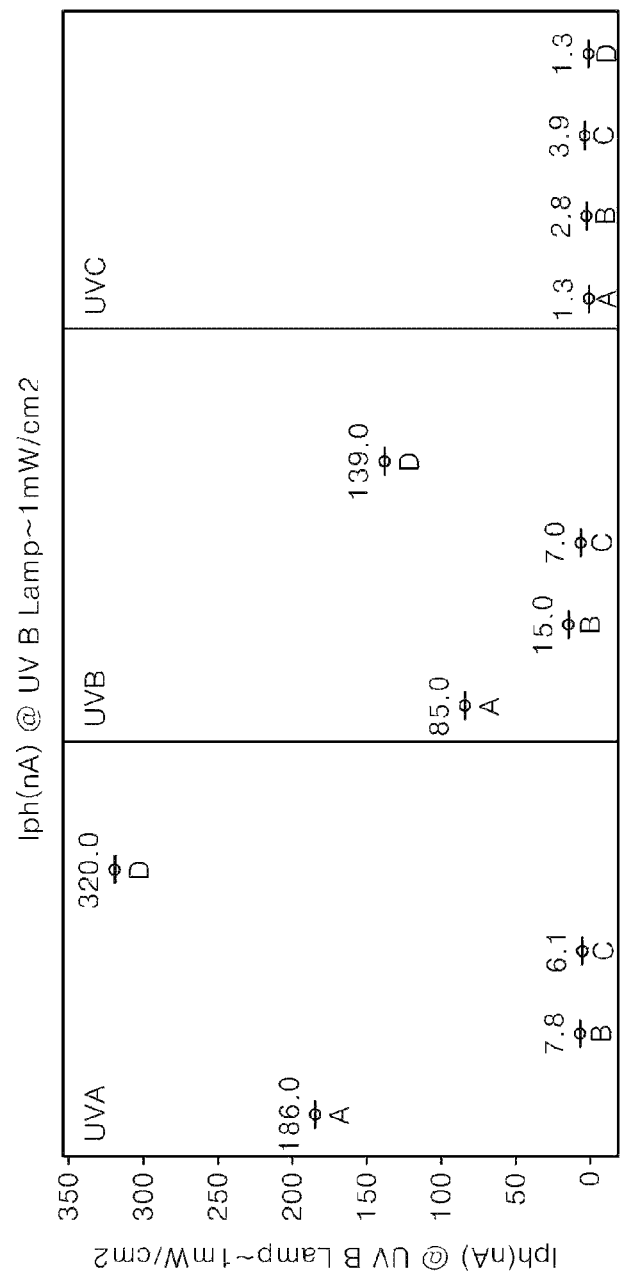
Figure 6:
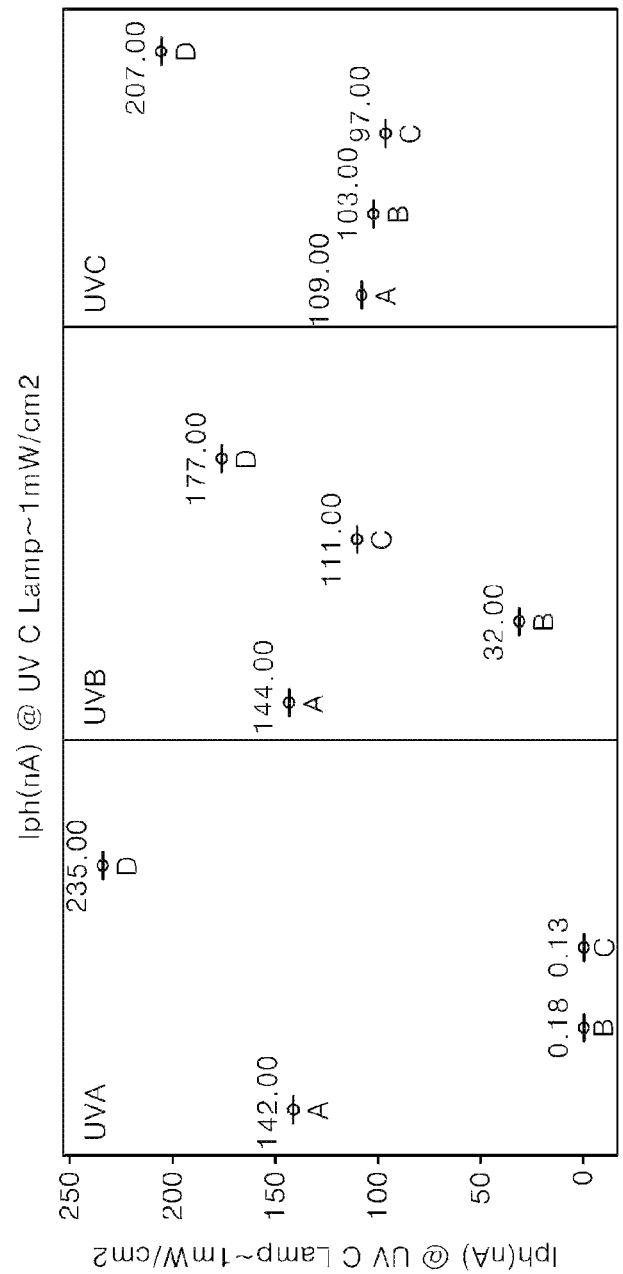

FIG. 4 to FIG. 6 are graphs depicting UV index measurement results obtained using various UVA, UVB and UVC sensors, in which UV light is detected using different UV sensors A, B, C, D according to UV wavelength.

For example, it can be confirmed from FIG. 3 to FIG. 5 that, when UVB having higher energy than UVA enters the UV sensor package, both the UVB sensor and the UVA sensor are activated at the same time, and, when UVC enters the UV sensor package, not only the UVC sensor but also the UVA and UVB sensors are activated. Accordingly, with such UV detection characteristics, the UV measuring device according to the exemplary embodiment can provide more accurate UV detection data.

That is, not only the detection result of the UVA sensor, but also the detection results of the UVB and UVC sensors can be comprehensively used in order to achieve more accurate calculation of the amount of UVB by digitizing and storing the degree of activation of each of the UV sensors in a database. Furthermore, in order to achieve more accurate calculation of the amount of UVB, not only the detection result of the UVB sensor but also the detection result of the UVC sensor can be comprehensively used.

Alternatively, the detection results of the UVA and UVB sensors may be used to obtain more accurate calculation of the amount of UVB, or the detection results of the UVA, UVB and UVC sensors may be used in order to calculate the amount of UVC.

In other words, since the UVA index displayed on the UVA sensor includes values related to UVB and UVC components, a more accurate UVA index can be obtained through correction depending upon the characteristics of the UV sensors. Conversely, since UVC is detected by all of the UVA, UVB and UVC sensors, a more accurate UVC index can be obtained through numerical correction depending upon the characteristics of each of the UV sensors.

Alternatively, since calculation results differ even under the same conditions depending upon manufacturer and performance of the UV sensors as shown in FIG. 4 to FIG. 6, a correction parameter corresponding to performance of each UV sensor can be predetermined.

For reference, when a combination of the UVA sensor and the UVB sensor 2 is used, more accurate calculation of the amounts of UVA and UVB can be obtained through correction of the detection results of these UV sensors.

As described above, the UV measuring device according to the exemplary embodiment can secure direct and accurate detection of UV quantity according to wavelength through application of the $In_xGa_{1-x}N$ (0<x1) or $Al_xGa_{(1-x)}N$ (0<x<1) UV sensors. Furthermore, according to the exemplary embodiment, such UV sensors are bonded to the read-out integrated circuit (ROIC) to form a package, thereby providing advantageous effects such as process simplification and reduction in manufacturing costs. Furthermore, bonding between the UV sensors and the read-out integrated circuit may be achieved using a bonding agent, such as a silver paste, which exhibits electrical conductivity and high thermal conductivity.

Figure 7:
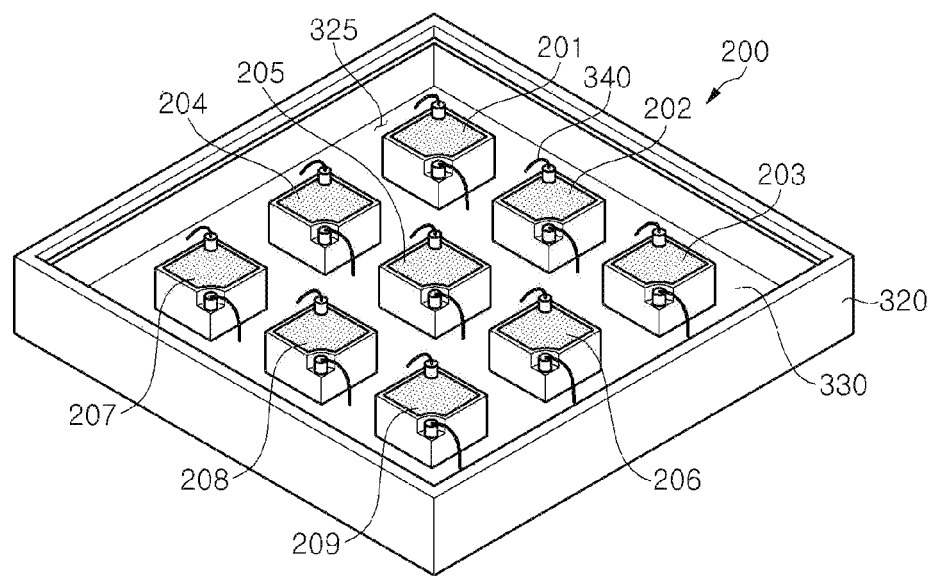
FIG. 7 to FIG. 9 are a perspective view, a plan view and a cross-sectional view of a photodetector according to exemplary embodiments of the present disclosure, respectively.
Figure 8:
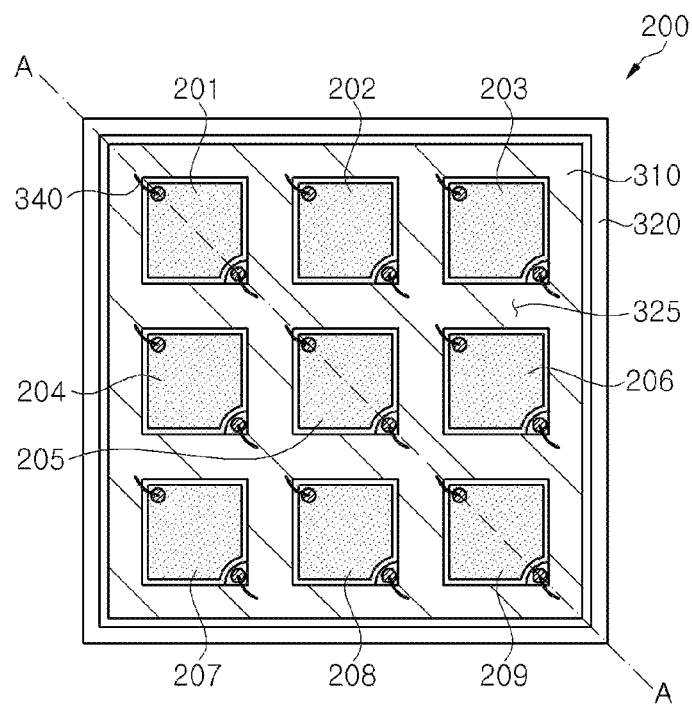
Figure 9:
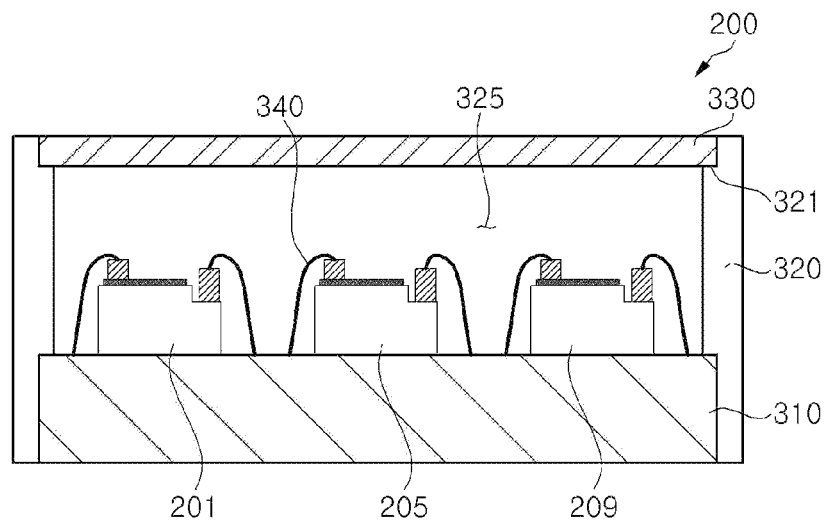
Figure 10:
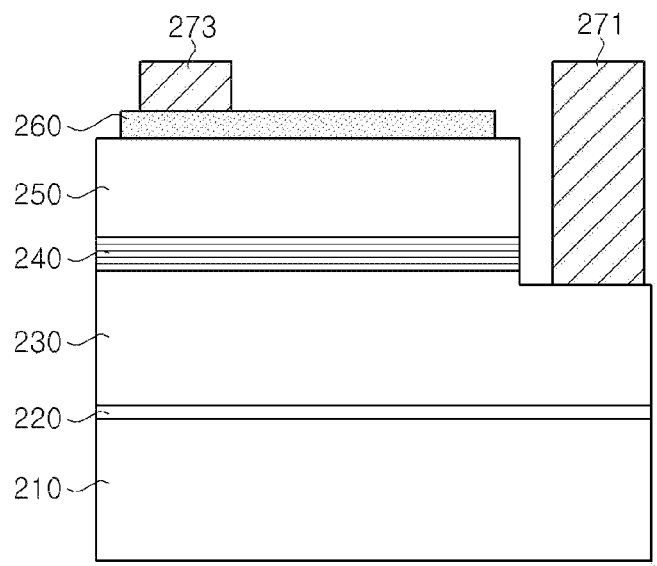
FIG. 10 is a sectional view of a semiconductor photodetection chip of the photodetector according to the exemplary embodiments of the present disclosure.
Figure 11:
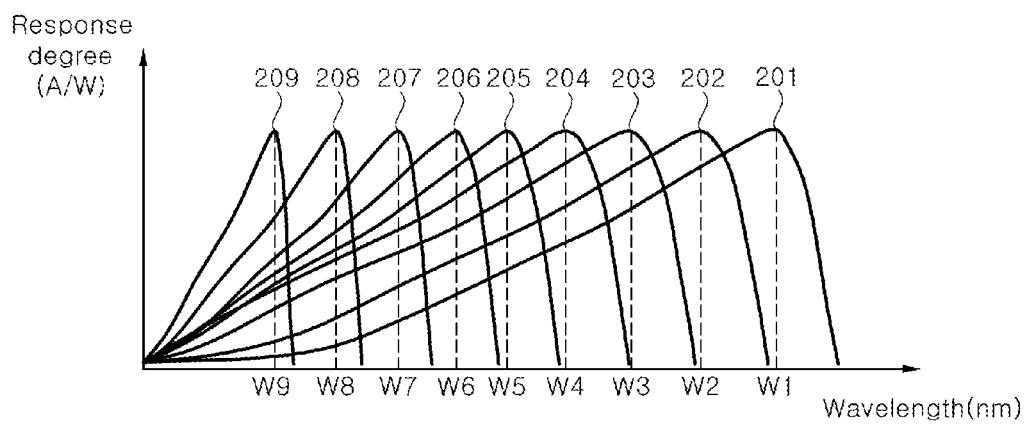
FIG. 11 is a graph depicting wavelength response of semiconductor photodetection chips of the photodetector according to the exemplary embodiments of the present disclosure.

FIG. 7 to FIG. 9 are a perspective view, a plan view and a cross-sectional view of a photodetector according to exemplary embodiments of the present disclosure, respectively. FIG. 10 is a sectional view of a semiconductor photodetection chip of the photodetector according to the exemplary embodiments of the present disclosure. FIG. 11 is a graph depicting wavelength response of semiconductor photodetection chips of the photodetector according to the exemplary embodiments of the present disclosure.

Referring to FIG. 7 to FIG. 9, a photodetector 200 includes a plurality of semiconductor photodetection chips 201 to 209. In addition, the photodetector 200 may further include a substrate 310, a sidewall 320, and a cover 330. The photodetector 200 may also include a read-out integrated circuit (ROIC), and may further include a processing unit (not shown), a memory unit (not shown), and an output unit (not shown).

The substrate 310 may be an insulating substrate or a conductive substrate, and may include a conductive pattern. The substrate 310 may be selected from any substrates that can support the plurality of semiconductor photodetection chips 201 to 209. For example, the substrate 310 may be a printed circuit board PCB having a conductive pattern formed thereon. Here, the plurality of semiconductor photodetection chips 201 to 209 may be electrically connected to the conductive pattern on the printed circuit board through wiring 340. In addition, the substrate 310 may include terminals (not shown) through which the photodetector 200 can be connected to the outside. These terminals may be disposed on a side surface or a lower surface of the substrate 310.

The substrate 310 may be provided with the read-out integrated circuit (ROIC), and may be further provided with the processing unit (not shown), the memory unit (not shown) and the output unit (not shown). The ROIC may be electrically connected to the plurality of semiconductor photodetection chips 201 to 209. The ROIC, the processing unit, the memory unit and the output unit may be disposed inside the substrate 310, or may be disposed on at least one surface of the substrate 310. For example, the plurality of semiconductor photodetection chips 201 to 209 may be disposed on an upper surface of the substrate 310, and the ROIC, the processing unit, the memory unit and the output unit may be disposed on a lower surface of the substrate 310. However, it should be understood that other implementations are also possible.

In various exemplary embodiments, at least one of the ROIC, the processing unit, the memory unit and the output unit may be disposed outside the substrate 310. In one example, the semiconductor photodetection chips 201 to 209 are disposed on the substrate 310 so as to be electrically connected to the substrate 310, and the ROIC, the processing unit, the memory unit the and output unit may be mounted on a separate substrate (not shown) outside the substrate 310, as shown in FIG. 7 to FIG. 9. Here, at least one of the ROIC, the processing unit, the memory unit and the output unit may be electrically connected to the substrate 310, which may also be electrically connected to the separate substrate. In another example, the ROIC is provided to the substrate 310, and the processing unit, the memory unit and the output unit may be mounted on a separate substrate outside the substrate 310. As such, various modifications can be made.

Details of the ROIC, the processing unit, the memory unit and the output unit will be described below.

The plurality of semiconductor photodetection chips 201 to 209 includes at least two semiconductor photodetection chips and may be disposed on the substrate 310. In this exemplary embodiment, the plurality of semiconductor photodetection chips 201 to 209 may include a first photodetection chip 201, a second photodetection chip 202, a third photodetection chip 203, a fourth photodetection chip 204, a fifth photodetection chip 205, a sixth photodetection chip 206, a seventh photodetection chip 207, an eighth photodetection chip 208, and a ninth photodetection chip 209. However, it should be understood that other implementations are also possible and the number of photodetection chips can be changed in various ways.

Each of the semiconductor photodetection chips 201 to 209 may be manufactured in various shapes, for example, Schottky junction semiconductor photodetection chips. FIG. 10 is a sectional view of a semiconductor photodetection chip according to one exemplary embodiment of the present disclosure.

Referring to FIG. 10, at least one of the semiconductor photodetection chips 201 to 209 includes a base layer 230, a light absorption layer 250, and a Schottky junction layer 260. Furthermore, the at least one of the semiconductor photodetection chips 201 to 209 may further include a substrate 210, a buffer layer 220, a low current blocking layer 240, a first electrode 271, and a second electrode 273.

The substrate 210 is disposed at a lower side of the semiconductor photodetection chip and may be a growth substrate allowing growth of semiconductor layers thereon. For example, the substrate 210 may include a sapphire substrate, a SiC substrate, a ZnO substrate, and a nitride-based substrate such as a GaN substrate or an AlN substrate. In this exemplary embodiment, the substrate 310 may be a sapphire substrate. Alternatively, the substrate 210 may be omitted.

The base layer 230 may be disposed on the substrate 310. The base layer 230 may include a nitride-based semiconductor layer such as (Al, In, Ga)N, and may include, for example, a GaN layer. The base layer 230 may be undoped or doped with n-type dopants, for example, Si. Since the nitride-based semiconductor can exhibit n-type characteristics in an undoped state, doping of the base layer may be determined as needed. When the base layer 230 is doped with n-type dopants including Si, the base layer 230 may have an Si dopant concentration of $1\times10^8$ or less. The base layer 230 may have a thickness of about 2 μm.

The buffer layer 220 may be interposed between the base layer 230 and the substrate 210. The buffer layer 220 may include a similar material to that of the base layer 230, for example, a GaN layer. The buffer layer 220 may have a thickness of about 25 nm and may be grown at a lower temperature (for example, 500° C. to 600° C.) than the base layer 230. The buffer layer 220 serves to improve crystallinity of the base layer 230, thereby improving optical and electrical properties of the base layer 230. In addition, when the substrate 210 is a heterogeneous substrate such as a sapphire substrate, the buffer layer 220 acts as a seed layer for growth of the base layer 230.

In addition, each of the buffer layer 220 and the base layer 230 may be composed of a single layer or multiple layers. The base layer 230 may include GaN layers grown under different process conditions, for example, under different growth temperatures, growth pressures, and source fluxes. Accordingly, the base layer 230 may have an n-type dopant concentration varying in a growth direction. Further, when the base layer 230 includes a ternary nitride semiconductor such as AlGaN, InGaN, and the like or a quaternary nitride semiconductor such as AlInGaN, nitride semiconductor layers having different composition ratios may be formed. For example, the base layer 230 may include at least one μ-GaN layer and at least one n-GaN layer formed on the μ-GaN layer. Alternatively, the base layer 230 may include a plurality of μ-GaN layers and a plurality of n-GaN layers, in which the μ-GaN layers and the n-GaN layers may be grown under different conditions.

The low current blocking layer 240 is disposed on the base layer 230 and may include a multilayer structure. The multilayer structure may include a binary to quaternary semiconductor layer including (Al, In, Ga)N, and may have a structure in which at least two nitride layers having different composition ratios are repeatedly stacked one above another. In this multilayer structure, each of the nitride layers may have a thickness of 5 nm to 10 nm. In addition, the multilayer structure may have a structure in which 3 to 10 pairs of nitride layers having different composition ratios are stacked.

Nitride semiconductor layers to be stacked in the multilayer structure may be determined according to the composition of a nitride layer of the light absorption layer 250. For example, when the light absorption layer 250 includes an AlGaN layer, the multilayer structure may have a repeatedly stacked structure of AlN/AlGaN layers or AlGaN/AlGaN layers. When the light absorption layer 250 includes an InGaN layer, the multilayer structure may have a repeatedly stacked structure of InGaN/InGaN layers, GaN/InGaN layers, or AlInGaN/AlInGaN layers, and when the light absorption layer 250 includes a GaN layer, the multilayer structure may have a repeatedly stacked structure of GaN/InGaN layers, InGaN/InGaN layers or GaN/GaN layers.

In addition, the low current blocking layer 240 may have a multilayer structure, in which band gap energy at an interface between layers of the multilayer structure may be larger than other portions thereof. The multilayer structure of nitride layers having different composition ratios may be provided by growing the nitride layers at different pressures. For example, when the multilayer structure has a repeatedly stacked structure of $Al_xGa_{(1-x)}N$ layers and $Al_yGa_{(1-y)}N$ layers, each of the $Al_xGa_{(1-x)}N$ layers may be grown at a pressure of about 100 Torr, and each of the $Al_yGa_{(1-y)}N$ layers may be grown at a pressure of about 400 Torr. Under the same growth conditions excluding pressure, the $Al_xGa_{(1-x)}N$ layers grown at a lower pressure may have a higher Al content than the of the $Al_yGa_{(1-y)}N$ layers grown at a higher pressure.

As such, the nitride layers grown at different pressures may have different growth rates due to a difference between the growth pressures. As the nitride layers have different growth rates, it is possible to block propagation of dislocations in the growth process or to change a propagation path of the dislocations, thereby reducing a dislocation density of other semiconductor layers grown in a subsequent process. Furthermore, when the composition ratios of the layers repeatedly stacked are different from each other, stress due to a difference in lattice constant can be relieved, thereby improving crystallinity of other semiconductor layers grown in the subsequent process while preventing damage to the semiconductor layers, such as cracks. In particular, when an AlGaN layer having an Al content of 15% or more is grown on the low current blocking layer 240, the AlGaN layer can be effectively prevented from suffering generation of cracks therein, which can occur upon formation of the AlGaN layer on an AlN layer or a GaN layer in the related art. According to this exemplary embodiment, the low current blocking layer 240 including the multilayer structure is formed under the light absorption layer 250, thereby providing good crystallinity to the light absorption layer 250 while preventing generation of cracks in the light absorption layer 250.

When the light absorption layer 250 has good crystallinity, quantum efficiency of the photodetection chip (at least one of 201 to 209) can be improved.

The low current blocking layer 240 may have a higher defect density than the light absorption layer 250. The defect density of the low current blocking layer 240 can be determined by controlling the growth conditions of the low current blocking layer 240. For example, the low current blocking layer 240 including a nitride semiconductor having a relatively high defect density can be provided by growing the low current blocking layer 240 at a lower temperature than the base layer 230 or by changing the growth pressure conditions. Defects in the low current blocking layer 240 can block minute current flowing from the light absorption layer 250 to the base layer 230 through the low current blocking layer 240. That is, electrons generating minute current are captured by the defects in the low current blocking layer 240, thereby preventing the photodetection chip (at least one of 201 to 209) from being affected by such minute current. As a result, the photodetection chip (at least one of 201 to 209) can have high detection efficiency.

The light absorption layer 250 is placed on the low current blocking layer 240. The light absorption layer 250 may include a nitride semiconductor layer, for example, at least one of a GaN layer, an InGaN layer, an AlInGaN layer and an AlGaN layer. Since the energy band gap is determined according to the kind of Group III element contained in the nitride semiconductor layer, the nitride semiconductor material of the light absorption layer 250 can be determined by taking into account the wavelength of light to be detected by at least one of the photodetection chips 201 to 209. For example, at least one of the photodetection chips 201 to 209 configured to detect UV light in the UVA range may include the light absorption layer 250 including a GaN layer or an InGaN layer, at least one of the photodetection chips 201 to 209 configured to detect UV light in the UVB range may include the light absorption layer 250 including an AlGaN layer having an Al content of 28% or less, and at least one of the photodetection chips 201 to 209 configured to detect UV light in the UVC range may include the light absorption layer 250 including an AlGaN layer having an Al content of 28% to 50%. However, it should be understood that other implementations are also possible.

The light absorption layer 250 may have a thickness of about 0.1 µm to 0.5 µm and may be formed to a thickness of 0.1 µm or more in order to improve light detection efficiency. Generally, since the light absorption layer 250 is formed on an AlN layer or a GaN layer, the light absorption layer 250 including an AlGaN layer having an Al content of 15% and grown to a thickness of 0.1 µm or more is likely to suffer from cracking. Accordingly, the light absorption layer 250 is formed to a thickness of 0.1 µm or less, thereby providing low production yield and low light detection efficiency. Conversely, according to the exemplary embodiments of the present disclosure, since the light absorption layer 250 is formed on the low current blocking layer 240 including the multilayer structure, the light absorption layer 250 can be formed to a thickness of 0.1 µm or more without suffering from generation of cracks therein. Accordingly, the photodetection chip (at least one of 201 to 209) according to the exemplary embodiments has high detection efficiency.

The Schottky junction layer 260 is disposed on the light absorption layer 250. The Schottky junction layer 260 and the light absorption layer 250 may form Schottky contact with each other, and the Schottky junction layer 260 may include at least one of indium tin oxide (ITO), Ni, Co, Pt, W, Ti, Pd, Ru, Cr, and Au. The Schottky junction layer 260 may have a thickness determined depending upon light transmission and Schottky characteristics thereof, for example, a thickness of 10 nm or less.

At least one of the photodetection chips 201 to 209 may further include a cap layer (not shown) interposed between the Schottky junction layer 260 and the light absorption layer 250. The cap layer may be a p-type nitride semiconductor layer doped with p-type dopants such as Mg. The cap layer may have a thickness of 100 nm or less, preferably 5 nm or less. The cap layer can enhance the Schottky characteristics of the photodetection chips.

At least one of the photodetection chips 201 to 209 may include an exposed surface region of the base layer 230, which is formed by partially removing the light absorption layer 250 and the low current blocking layer 240. A second electrode 273 may be disposed on the exposed region of the base layer 230 and a first electrode 271 may be disposed on the Schottky junction layer 260.

The first electrode 271 may include a metal and may be composed of multiple layers. For example, the first electrode 271 may include a stacked structure of Ni and Au layers. The second electrode 273 may form ohmic contact with the base layer 230 and may be composed of multiple layers including a metal. For example, the second electrode 273 may include a stacked structure of Cr, Ni and Au layers. However, it should be understood that other implementations are also possible. Specifically, each of the first electrode 271 and the second electrode 273 may have any structure allowing the first electrode 271 and the second electrode 273 to be electrically connected to the Schottky junction layer 260 and the base layer 230, respectively.

Referring again to FIG. 7 to FIG. 9, each of the semiconductor photodetection chips may exhibit peak response at different wavelengths. For example, each of the first to ninth photodetection chips 201 to 209 may have wavelength responses, as shown in FIG. 11. That is, the first photodetection chip 201 exhibits peak response at a relatively long wavelength and the ninth photodetection chip 209 exhibits peak response at a relatively short wavelength. Furthermore, the first to ninth photodetection chips 201 to 209 may exhibit peak response with respect to light having first to ninth wavelengths W1 to W9. Here, the first to ninth wavelengths W1 to W9 may be sequentially decreased from the first wavelength W1 to the ninth wavelength W9 by a substantially constant value. Accordingly, the photodetector according to the exemplary embodiment can exhibit substantially uniform light detection characteristics in a broad wavelength band.

Furthermore, the first to ninth photodetection chips 201 to 209 may be separated at constant intervals from each other and may be arranged in a regular pattern. For example, as shown in FIG. 1 and FIG. 2, the first to ninth photodetection chips 201 to 209 may be arranged in a 3×3 matrix to be separated at constant intervals from each other. Accordingly, the first to ninth photodetection chips 201 to 209 can substantially uniformly receive light, whereby the photodetector 200 can exhibit substantially uniform light detection characteristics.

The sidewall 320 may be placed on the substrate 310 and surround the plurality of semiconductor photodetection chips 201 to 209. Thus, a cavity 225 can be defined in a space surrounded by the sidewall 320 and the plurality of semiconductor photodetection chips 201 to 209 may be disposed inside the cavity 225. The sidewall 320 servers to protect the plurality of semiconductor photodetection chips 201 to 209 while guiding incident light towards the plurality of semiconductor photodetection chips 201 to 209. Thus, the sidewall 320 may have light reflection or translucent characteristics. The sidewall 320 may be formed of various polymeric, ceramic or metallic materials.

The cover 330 is supported by an end portion 321 of the sidewall 320 to be placed above the plurality of semiconductor photodetection chips 201 to 209. The cover 330 may be separated from the plurality of semiconductor photodetection chips 201 to 209 and cover the cavity 225 to protect the plurality of semiconductor photodetection chips 201 to 209. The cover 330 may have light transmitting properties such that light can pass therethrough. The cover 330 may be formed of, for example, a light transmitting polymer, a light transmitting ceramic material, or a light transmitting glass.

Figure 12:
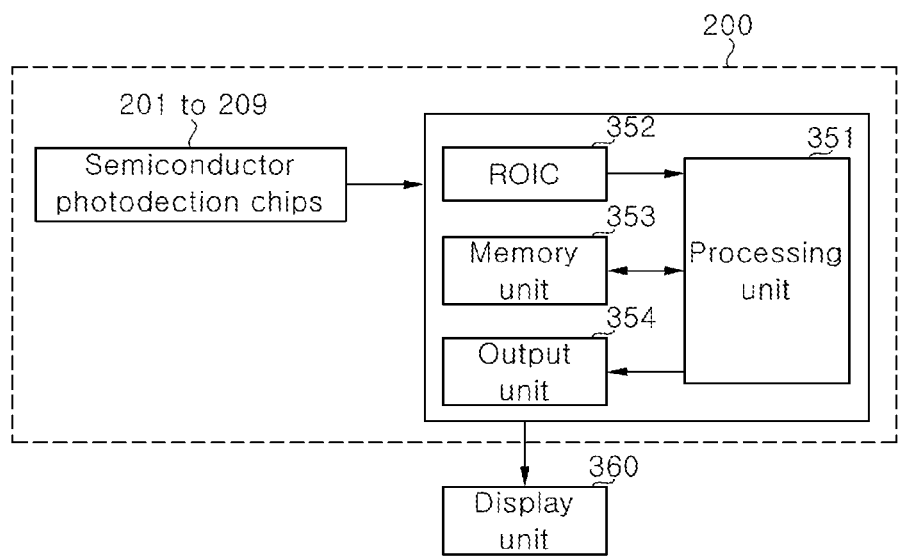
FIG. 12 is a block diagram of a photodetector according to exemplary embodiments of the present disclosure and an electronic device including the same.
Figure 13:
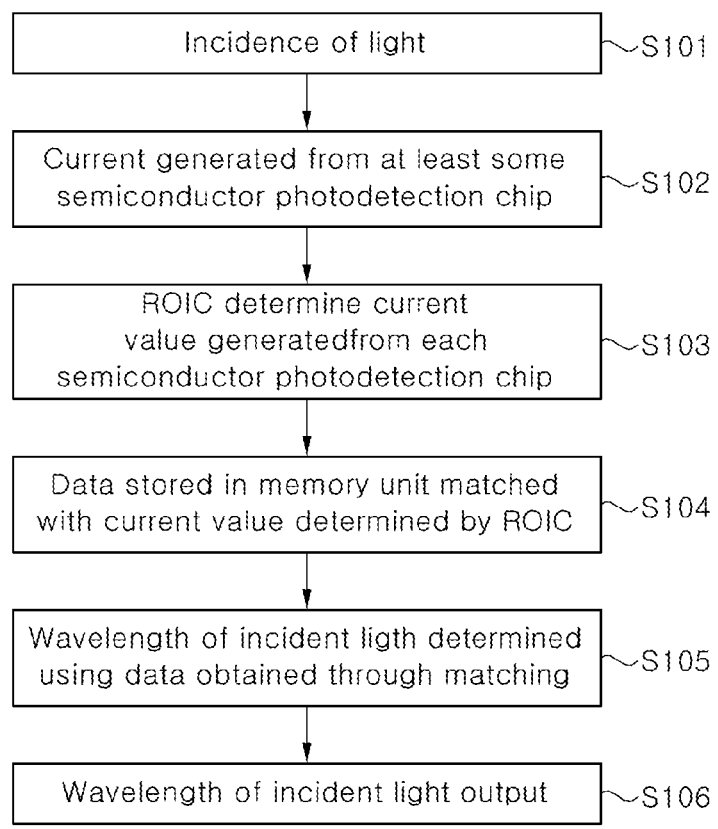
FIG. 13 is a flow diagram illustrating operation of the photodetector according to the exemplary embodiments of the present disclosure.

Next, the photodetector 200 according to various exemplary embodiments, operation of the photodetector 200, and an electronic device including the photodetector 200 will be described with reference to FIG. 12 and FIG. 13. FIG. 12 is a block diagram of a photodetector according to exemplary embodiments of the present disclosure and an electronic device including the same, and FIG. 13 is a flow diagram illustrating operation of the photodetector according to the exemplary embodiments of the present disclosure.

Referring to FIG. 12, according to the exemplary embodiments, a photodetector 200 may include a plurality of semiconductor photodetection chips 201 to 209 and a readout integrated circuit (ROIC) 352, and may further include a processing unit 351, a memory unit 353, and an output unit 354. The photodetector 200 may further include a substrate 310, and the ROIC 352 may be provided to the substrate 310. The substrate 310 may further include at least one of the processing unit 351, the memory unit 353, and the output unit 354.

In addition, exemplary embodiments of the present disclosure may provide an electronic device including the photodetector 200. The electronic device may further include a display unit 360 that displays data of incident light output from the photodetector 200.

First, the plurality of semiconductor photodetection chips 201 to 209 may include at least two semiconductor photodetection chips, for example, first to ninth semiconductor photodetection chips 201 to 209, as described in FIG. 7 to FIG. 11.

The ROIC 352 may be electrically connected to the plurality of semiconductor photodetection chips 201 to 209 and may determine current values generated from the plurality of semiconductor photodetection chips 201 to 209. Here, the ROIC 352 may individually determine the current value generated from each of the semiconductor photodetection chips 201 to 209. For example, when electric current is generated from the first to fourth semiconductor photodetection chips 201, 202, 203, 204 in response to incident light, the ROIC 352 can individually determine the electric current generated from each of the first to fourth semiconductor photodetection chips 201, 202, 203, 204. As described above, the ROIC 352 may be disposed inside or outside the substrate 310.

The memory unit 353 may include wavelength response data of each of the semiconductor photodetection chips 201 to 209. For example, the memory unit 353 may store data corresponding to a wavelength response graph as shown in FIG. 5. Thus, the memory unit 353 may provide wavelength data of incident light according to electric current (response) generated from each of the plurality of semiconductor photodetection chips 201 to 209. The memory unit 353 may be any media capable of storing data without limitation, and may include, for example, a semiconductor storage device. As described above, the memory unit 353 may be disposed inside or outside the substrate 310.

The processing unit 351 may be connected to the ROIC 352 and the memory unit 353 and matches the current values determined by the ROIC 352 with the response data of the plurality of semiconductor photodetection chips 201 to 209 stored in the memory unit 353. The processing unit 351 determines the wavelength of incident light through such matching operation. Accordingly, the processing unit 351 can receive the current values of the plurality of semiconductor photodetection chips 201 to 209 from the ROIC 352, and may transmit or receive data from the memory unit 353. In addition, the processing unit 351 can transmit the wavelength data of the incident light to other components, for example, to the output unit 354. The processing unit 351 may include a processor. As described above, the processing unit 351 may be configured to be included in the substrate 310, or may be disposed outside the substrate 310. As described above, the processing unit 351 may be disposed inside or outside the substrate 310.

The output unit 354 may be connected to the processing unit 351, and may receive the wavelength data of the incident light from the processing unit 351 and output the received wavelength data to the outside. As described above, the output unit 354 may be disposed inside or outside the substrate 310.

Next, operation of the photodetector 200 will be described with reference to FIG. 13. First, light enters the photodetector 200 (S101). Then, at least some of the semiconductor photodetection chips 201 to 209 respond to the incident light. As a result, electric current is generated from the semiconductor photodetection chips responding to the incident light. Here, the electric current may differ depending upon the degree of response of each of the semiconductor photodetection chips (S102). The electric current is transmitted to the ROIC 352, which in turn measures the electric current to determine the magnitude of the electric current and the semiconductor photodetection chips generating the corresponding electric current (S103). Then, the processing unit 351 receives the current value determined by the ROIC 352, and the wavelength response data of each of the semiconductor photodetection chips form the memory unit 353. The processing unit 351 matches the received current values with the response data (S104). The processing unit 351 determines the wavelength of the incident light based on data obtained through the matching operation (S105). Next, the processing unit 351 transmits the wavelength data of the incident light to the output unit 354, which in turn outputs the wavelength data to the outside (S106).

Figure 14:
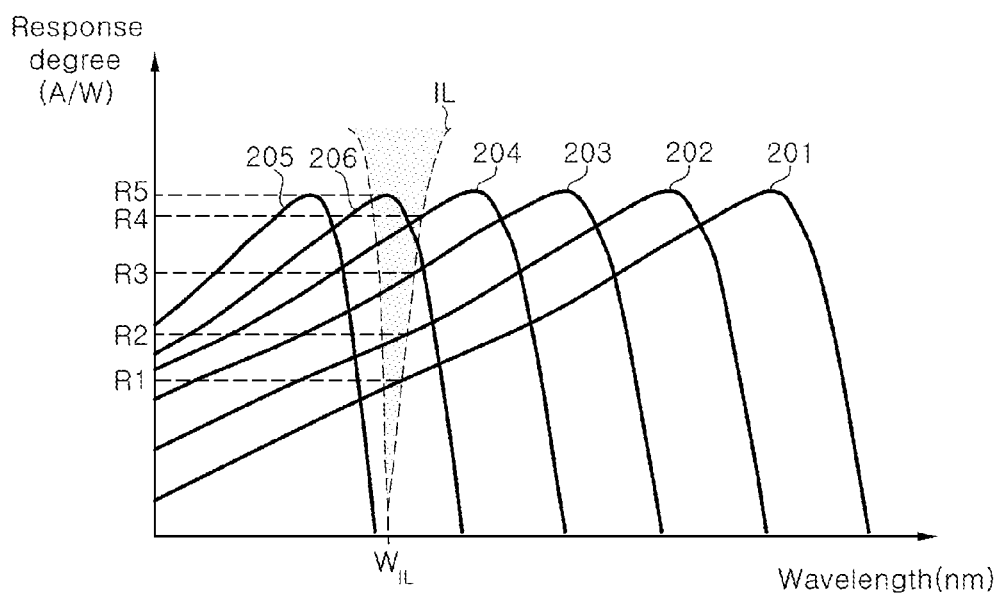
FIG. 14 is a graph depicting one example of operation of the photodetector according to the exemplary embodiments of the present disclosure.

Examples of operation of the photodetector 200 and a method of determining the wavelength of incident light will be described in more detail with reference to FIG. 14. FIG. 14 is a graph depicting one example of the operation of the photodetector according to the exemplary embodiments of the present disclosure.

Referring to FIG. 14, incident light IL having a peak wavelength WIL enters the photodetector 200. The first to fifth semiconductor photodetection chips 201 to 205 generates electric current in response to the incident light IL according to the wavelength band of the incident light IL. Here, the first semiconductor photodetection chip 201 may have a response degree R1 and generate electric current corresponding to the response degree R1 of the first semiconductor photodetection chip 201. Likewise, the second semiconductor photodetection chip 202 generates electric current corresponding to a response degree R2, the third semiconductor photodetection chip 203 generates electric current corresponding to a response degree R3, the fourth semiconductor photodetection chip 204 generates electric current corresponding to a response degree R4, and the fifth semiconductor photodetection chip 205 generates electric current corresponding to a response degree R5. The current values generated from the first to fifth semiconductor photodetection chips 201 to 205 are determined by the ROIC 352. The ROIC 352 can individually determine the current value generated from each of the semiconductor photodetection chips. The processing unit 351 matches the current values with the response data stored in the memory unit 353 to determine the wavelength band of the incident light IL.

As such, the photodetector 200 according to the exemplary embodiments includes the plurality of semiconductor photodetection chips and stores the response data of the plurality of semiconductor photodetection chips to determine the wavelength band of the incident light by comparing the response data with the electric current actually generated in response to the incident light. Accordingly, the photodetector 200 according to the exemplary embodiments can broaden the detectable wavelength band using a plurality of semiconductor photodetection chips, as compared with a general photodetector capable of detecting only light in a narrow band of wavelengths.

Since a general photodetector responds only to light in a specific wavelength band or has different cut-off slopes and half-widths of response depending upon the characteristics of applied semiconductors thereof, it is disadvantageous to apply different photodetectors depending upon application thereof. For example, if light in the UVC range and light in the UVA range need to be detected simultaneously, at least two photodetectors are required. On the other hand, the photodetector 200 according to the exemplary embodiments can detect light in a wide wavelength band, and thus there is no need to select the photodetector according to application. That is, according to the exemplary embodiments, a universal photodetector capable of being applied regardless of the wavelength of incident light can be provided.

Furthermore, the photodetector 200 does not require a filter, thereby enabling simplification and size reduction of the photodetector 200. A general Si-based photodetector provides an insignificant difference in response according to wavelength and thus requires a filter in order to detect light having a particular wavelength. On the other hand, the plurality of semiconductor photodetection chips 201 to 209 formed of a nitride semiconductor exhibits a clear difference in response according to wavelength and has response with a cut-off inclination, thereby enabling accurate detection of the wavelength of incident light without a filter. Accordingly, for the photodetector 200 including the semiconductor photodetection chips formed of the nitride semiconductor, the semiconductor photodetection chips are designed to exhibit peak response at different wavelengths, thereby providing a universal photodetector from which the filter is omitted.

The electronic device according to the exemplary embodiments may include the photodetector 200. The electronic device may be any electronic device requiring detection of incident light and determination of wavelengths of the incident light. For example, the electronic device may include a portable electronic device requiring a photosensor (for example, a smartphone, an electronic watch, a smart watch, a portable medical device, and the like), a medical device requiring a photosensor, a security device requiring a photosensor, and the like. In some exemplary embodiments, the electronic device may further include a display unit 360, on which wavelength data of incident light determined by the photodetector 200 can be displayed.

Figure 15:
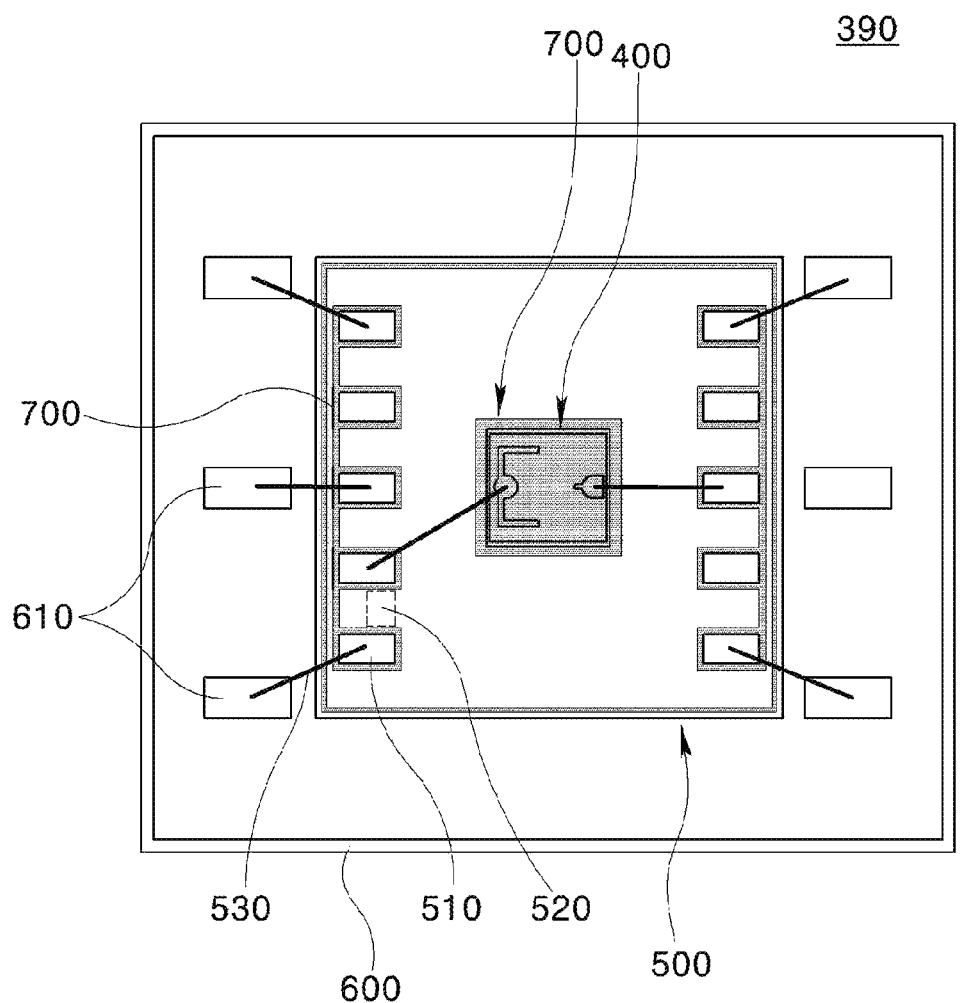
FIG. 15 is a plan view of a UV detector according to one exemplary embodiment of the present disclosure.
Figure 16:
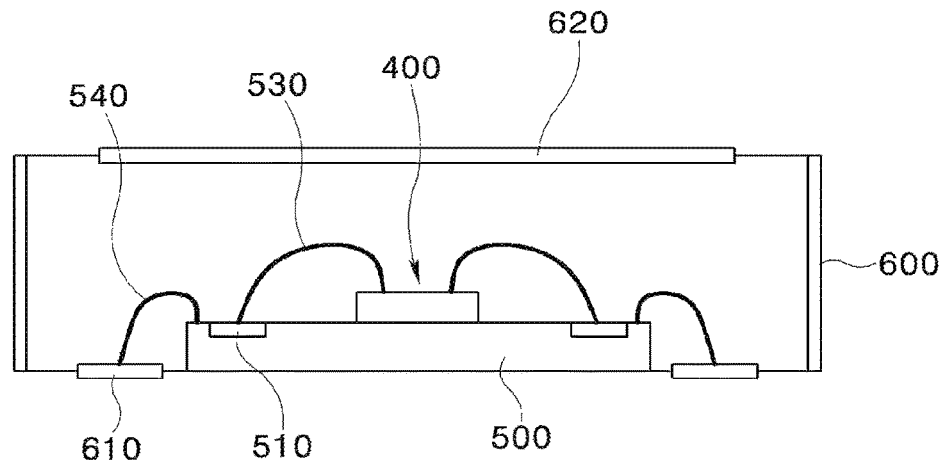
FIG. 16 is a cross-sectional view of the UV detector according to the exemplary embodiment of the present disclosure.

FIG. 15 is a plan view of a housing including a UV detection element according to one exemplary embodiment of the present disclosure, and FIG. 16 is a cross-sectional view of the housing including the UV detection element according to the exemplary embodiment of the present disclosure.

Referring to FIG. 15 and FIG. 16, a UV detector 390 according to one exemplary embodiment includes a UV detection element 400, an integrated circuit 500 having a light blocking layer 700 formed thereon, and a housing 600.

The UV detection element 400 is a GaN-based semiconductor element and bonded to an upper surface of the integrated circuit 500. The UV detection element 400 may have a substantially rectangular shape in plan view. The UV detection element may be a UV sensor corresponding to at least one of UVA, UVB, and UVC ranges, and at least two of UV sensors corresponding to the UVA, UVB, and UVC ranges may be bonded to the integrated circuit.

The integrated circuit 500 converts an analog signal output from the UV detection element 400 into a digital signal and transmits the digital signal to the memory unit to represent the digital signal as a programmed value such that the digital signal can be displayed through the display unit. The integrated circuit 500 is mounted in a central region of an upper surface of the housing 600 and may have a substantially rectangular shape.

The integrated circuit 500 may be made as a silicon-based IC. For example, a silicon substrate of the integrated circuit 500 may be a p-type (or n-type) semiconductor doped with dopants, and a p-type (or n-type) region is formed by attaching an n-type (or p-type) silicon thin layer to the silicon substrate to provide a circuit having a combination of the p-type and n-type semiconductor regions.

The UV detection element 400 is bonded to the upper surface of the integrated circuit 500, and a plurality of pads 510 may be formed on the integrated circuit 500 to be placed near the UV detection element 400. The pads 510 are electrically connected to a first electrode and/or a second electrode of the UV detection element 400 via a first conductive wire 530 so that an analog signal output from the UV detection element 400 can be input to the integrated circuit.

The integrated circuit 500 may be provided with a circuit such as a Zener diode to improve electrostatic discharge (ESD) protection characteristics. For example, the integrated circuit 500 may be further provided with a separate ground pad 520 in order to prevent the electrodes of the UV detection element vulnerable to ESD from being directly connected to electrodes of the housing.

The ground pad 520 may be disposed adjacent to, for example, a pad connected to a source VSS among the plurality of pads 510. The pads 510 are electrically connected to the electrodes 610 of the housing 600 via second conductive wires 540. Accordingly, the electrodes 480, 490 (see FIG. 17) of the UV detection element 400 are connected to the electrodes 610 of the housing 600 via the pads 510 having an ESD protection device, like the Zener diode of the integrated circuit 500, instead of being directly connected thereto, thereby preventing the conductive wire from being exposed to the outside, and the UV detection element 400 can be protected from electrostatic discharge by the ground pad 520 provided to the integrated circuit 500.

The integrated circuit 500 may have an exposed region formed upon formation thereof. When the integrated circuit 500 is exposed to sunlight, not only UV light but also visible light and IR light can enter the integrated circuit 500. Then, the integrated circuit 500 can generate electric current in response to light and the electric current generated by the integrated circuit affects a UV signal detected by the UV detection element 400, thereby having an influence on accuracy in UV detection.

Thus, the light blocking layer is formed on the entirety of the surface of the integrated circuit, to which the UV detection element is bonded, so as to shield a photoreactive region.

The integrated circuit 500 may have regions capable of generating electric current in response to light in any wavelength bands, for example, an analog digital converter (ADC) block region in which an analog signal output from the UV detection element 400 is converted into a digital signal, a pad periphery region electrically connected the electrodes of the UV detection element 400 and the electrodes of the housing 600, and a sealing region formed around the periphery of the integrated circuit 500 to provide a boundary between a die and a scribing line. The light blocking layer is further formed on such regions that can generate electric current in response to light in any wavelength bands, thereby securing complete sielding of the photoreactive region. The structure of the light blocking layer will be described below with reference to FIG. 5.

The housing 600 receives the UV detection element 400 and the integrated circuit 500 and may have a substantially rectangular shape in plan view.

The housing 600 is provided at the center of an upper surface thereof with the integrated circuit 500, and a plurality of electrodes, for example, a source VSS, a drain VDD, a communication electrode, a ground electrode GND, and the like, is disposed around the integrated circuit 500 on the upper surface of the housing 600. One of the electrodes, for example, the source, may be electrically connected to one of the pads 510 of the integrated circuit 500 via a conductive wire.

The UV detection element 400 is bonded to the upper surface of the integrated circuit 500 and the housing 600 may be provided on the upper surface thereof with a transparent window 620 facing the UV detection element 400. The window 620 may be formed of, for example, quartz.

Alternatively, instead of forming the window on the housing, the housing 600 may be filled with fillers so as to seal the UV detection element 400 and the integrated circuit 500. The fillers may be formed of a transparent silicone material allowing transmission of UV light therethrough. The silicone material may be used when the intensity of UV light is low. When the intensity of UV light is high, the fillers can suffer from yellowing and thus cannot be used for a long period of time.

Figure 17:
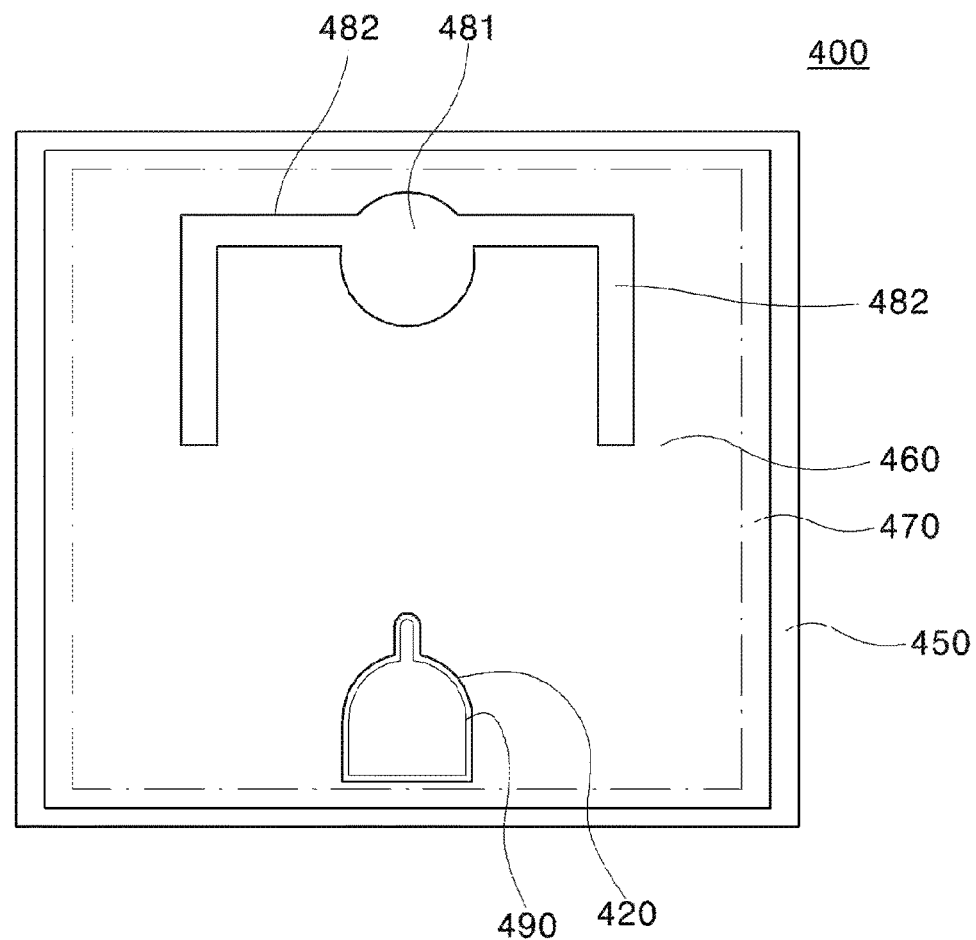
FIG. 17 is a plan view of a UV detection element applied to the UV detector according to the exemplary embodiment of the present disclosure.
Figure 18:
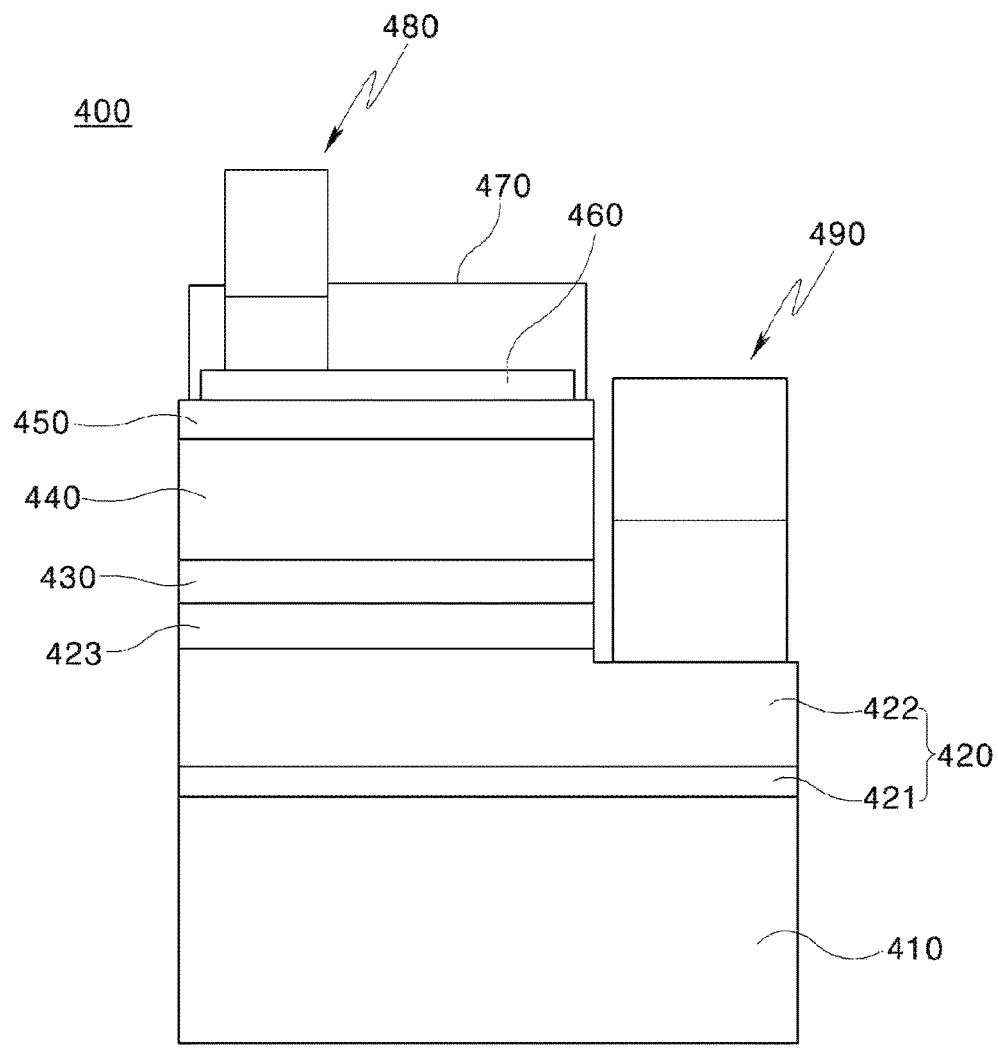
FIG. 18 is a cross-sectional view of the UV detection element applied to the UV detector shown in FIG. 15.

FIG. 17 is a plan view of one example of the UV detection element applied to the UV detector shown in FIG. 15, and FIG. 18 is a cross-sectional view of one example of the UV detection element applied to the UV detector shown in FIG. 15.

Referring to FIG. 17 and FIG. 18, the UV detection element 400 includes a substrate 410, a buffer layer 420, a low current blocking layer 430, a light absorption layer 440, a capping layer 450, a Schottky layer 460, and an insulation layer 470. In addition, the UV detection element according to the exemplary embodiment may further include a first electrode 480 and a second electrode 490 to be electrically connected to the pads 510 of the integrated circuit 500 via first conductive wires 530.

The substrate 410 is used to grow semiconductor single crystals and may be formed of zinc oxide (ZnO), gallium nitride (GaN), silicon carbide (SiC), aluminum nitride (AlN), and the like. In addition, a sapphire substrate prepared through precise polishing without scratches or marks may be mainly used as the substrate 410. When the sapphire substrate is applied to the UV detection element 400, the UV detection element 400 can be naturally isolated from the integrated circuit 500 even after the UV detection element 400 is bonded to the integrated circuit 500. At this time, the UV detection element 400 is directly bonded to the integrated circuit 500, thereby facilitating fabrication of the UV detector 390.

The buffer layer 420 may include a low temperature buffer layer 421 formed on the substrate 410 and a high temperature buffer layer 422 formed on the low temperature buffer layer 421.

The low temperature buffer layer 421 may include, for example, a GaN layer. The low temperature buffer layer 421 may be grown on the substrate 410 by the following procedure: With the substrate placed on a susceptor of an MOCVD apparatus, a pressure inside a reaction chamber is lowered to 100 torr or less to remove an impurity gas from the reaction chamber. Then, a surface of the heterogeneous substrate 410 is thermally cleaned by maintaining the internal pressure of the reaction chamber at 100 torr while increasing the inner temperature of the reaction chamber to 1,100° C., followed by decreasing the inner temperature to 500° C. to 600° C., preferably 550° C., and supplying a Ga source and ammonia ($NH_3$) gas into the reaction chamber, thereby forming the low temperature buffer layer 421. At this time, the overall gas flow of the reaction chamber is determined by hydrogen ($H_2$) gas.

The low temperature buffer layer 421 may be formed to a thickness of 25 nm or more to secure crystallinity and optical and electrical characteristics of the high temperature buffer layer 422 grown on the low temperature buffer layer 421.

The low temperature buffer layer 421 can serve to improve crystallinity of the high temperature buffer layer 422, thereby improving the optical and electrical characteristics of the high temperature buffer layer 422. In addition, when the substrate 410 is a heterogeneous substrate such as a sapphire substrate, the low temperature buffer layer 421 can act as a seed layer for growth of the high temperature buffer layer 422.

After growth of the low temperature buffer layer 421, the high temperature buffer layer 422 may be grown at a higher temperature than the low temperature buffer layer. The high temperature buffer layer 422 may be grown by, for example, increasing the temperature of the susceptor to 1,000° C. to 1,100° C., preferably to 1,050° C. If the temperature is less than 1,000° C., optical, electrical and crystallographic characteristics of the high temperature buffer layer 422 deteriorate, and if the temperature exceeds 1,100° C., the high temperature buffer layer 422 can suffer from deterioration in surface roughness and crystallinity.

The high temperature buffer layer 422 may include a material similar to the low temperature buffer layer. The high temperature buffer layer may include, for example, a GaN layer. Although a nitride semiconductor exhibits n-type characteristics without doping, the nitride semiconductor may also be doped with Si in order to secure the n-type characteristics. When the high temperature buffer layer 422 is doped with n-type dopants including Si, the doping concentration of Si may be $1 \times 10^8$ or less. The high temperature buffer layer 422 may have a thickness of about 2.5 µm.

In addition, the high temperature buffer layer 422 may be formed by growing an undoped GaN layer to a thickness of 1.5 µm on the low temperature buffer layer 421, and an ESD protection layer 423 may be formed on the high temperature buffer layer 422 by growing an undoped GaN layer to a thickness of 1 µm for ohmic contact upon formation of the first electrode, for example, an n-electrode. That is, since the UV detection element of the Schottky junction structure has lower ESD protection characteristics than that of a PIN structure due to the characteristics of Schottky junction, the undoped GaN layer may be further grown for improvement of electrostatic discharge (ESD) protection before growth of the low current blocking layer 430 in order to improve electrostatic discharge (ESD) protection of the Schottky junction structure. The high temperature buffer layer 422 grown in this way can improve electrostatic discharge (ESD) protection.

The low current blocking layer 430 is grown on the high temperature buffer layer 422 at a lower temperature than the light absorption layer 440. The low current blocking layer 430 may have a multilayer structure having different Al contents in each layer. For example, the low current blocking layer 430 may be formed by stacking a plurality of AlGaN layers having different Al contents. In addition, the low current blocking layer may be composed of a single AlGaN layer, the Al content of which may be the same as that of the light absorbing layer.

The nitride semiconductor layers stacked on the low current blocking layer 430 may be determined according to the compositions of the nitride layers of the light absorption layer 440. For example, when the light absorption layer 440 includes an AlGaN layer having an Al content of 20%, the low current blocking layer may include a repeatedly stacked structure of AlGaN/AlGaN layers.

The stacked structure of nitride layers having different composition ratios may be provided by growing the nitride layers at different pressures. For example, when the low current blocking layer forms a multilayer structure including a repeated stacked structure of $Al_xGa_{1-x}N$ and $Al_yGa_{1-y}N$ layers, the $Al_xGa_{1-x}N$ layer may be grown at a pressure of about 100 Torr and the $Al_yGa_{1-y}N$ layer may be grown at a pressure of about 400 Torr.

Here, if the growth conditions are the same except for pressure, the $Al_yGa_{1-y}N$ layer grown at a lower pressure may have a higher Al content than the $Al_yGa_{1-y}N$ layer grown at a higher pressure.

As such, the nitride layers are grown at different pressures can have different growth rates due to differences in growth pressures. Since the nitride layers have different growth rates, stress due to a difference in lattice constant can be relieved when the composition ratios of the nitride layers repeatedly stacked are different from each other, thereby improving crystallinity of other semiconductor layers grown in the subsequent process while preventing damage such as cracks.

In the UV detection element according to the exemplary embodiments, electrons generated in the light absorption layer 440 by visible light are captured by the low current blocking layer 430, thereby preventing the device from being driven by visible light as much as possible. As described above, the low current blocking layer 430 is grown at a lower temperature than the light absorption layer 440 and thus has a higher defect density. The number of electrons generated by visible light is much smaller than the number of electrons generated by ultraviolet light, and thus, defects present in the low current blocking layer 430 can sufficiently prevent electron migration. That is, the low current blocking layer 430 has a higher defect density than the light absorption layer 440 and thus can prevent migration of the electrons generated by visible light.

On the other hand, since the number of electrons generated by irradiation of the light absorption layer 440 with UV light is much larger than the number of electrons generated by visible light, the electrons generated by UV light are not captured by the low current blocking layer 430 and can generate electric current in the device. Thus, the UV detection element according to the exemplary embodiment has very low response degree to visible light, thereby providing a much higher ratio of UV to visible light response. Thus, according to the exemplary embodiment, the UV detection element can have high detection efficiency and reliability.

The low current blocking layer 430 may have an overall thickness of 100 nm or less in order to minimize the flow of electric current generated due to light energy other than UV light absorbed in the light absorption layer 440. When the low current blocking layer 430 is composed of multiple layers, the layers constituting the low current blocking layer 430 may have the same thickness or different thicknesses from each other, and the thickness of each layer and the number of layers may be suitably selected as needed.

The low current blocking layer 430 may have a higher defect density than the light absorption layer 440. This can be achieved by growing the low current blocking layer 430 at a lower temperature than the light absorption layer 440. For example, the light absorption layer 440 may be grown at about 1,050° C. and the low current blocking layer 430 may be grown at a lower temperature than the light absorption layer 440 by about 30° C. to 200° C. When the low current blocking layer 430 is grown at a lower temperature than the light absorption layer 440 by great than 200° C., the light absorption layer 440 grown on the low current blocking layer 430 can suffer from significant deterioration in crystallinity, thereby causing deterioration in quantum efficiency of the light absorption layer 440. Thus, the low current blocking layer 430 is preferably grown at a lower temperature than the light absorption layer 440 by 200° C. or less. When the low current blocking layer 430 is grown at a lower temperature than the light absorption layer 440, the low current blocking layer 430 can have a higher density of defects such as dislocations, vacancies, and the like than the light absorption layer 440.

The light absorption layer 440 is grown on the low current blocking layer 430. For example, the light absorption layer 440 composed of an $Al_xGa_{1-x}N$ (0<x<0.7) layer may be grown on the low current blocking layer 430.

Although the light absorption layer 440 can be grown to a thickness of 0.05 μm to 0.5 μm, it is desirable that the light absorption layer 440 be grown to a thickness of about 0.1 μm by taking into account influence of cracks.

In addition, the energy band gap of the light absorption layer 440 varies depending upon the wavelength range of light to be absorbed and the light absorption layer 440 having a desired energy band gap can be selectively grown by suitably adjusting the Al content.

The capping layer 450 is grown on the light absorption layer 440. After growth of the light absorption layer 440, for example, the capping layer 450 may be grown thereon by forming an AlGaN layer having a higher Al content than the light absorption layer. That is, when the capping layer 450 is formed by growing the AlGaN layer having a higher Al content than the light absorption layer 440, the Schottky barrier characteristics of the capping layer can be maximized, thereby making it easier to obtain Schottky characteristics.

The capping layer 450 may have a thickness of 1 nm to 10 nm, and if the thickness of the capping layer 450 is too thick, the capping layer 450 can exhibit the characteristics of the light absorption layer.

The Schottky layer 460 is formed in a region on the capping layer 450. The Schottky layer 460 may include any one of ITO, Ni, ATO, Pt, W, Ti, Pd, Ru, Cr, and Au. Particularly, when the Schottky layer 460 is formed of Ni which exhibits good UV transmittance, the ultraviolet light transmittance of the Schottky layer 460 can be lowered with increasing thickness thereof. Thus, the Schottky layer 460 may be formed to a thickness of 3 nm to 10 nm in consideration of good UV light transmittance and Schottky barrier characteristics.

The insulation layer 470 may be formed to seal the Schottky layer 460 on the capping layer. For example, the insulation layer 470 may be formed to cover the Schottky layer 460 while covering a portion of the capping layer 450 exposed along the periphery of the Schottky layer 460. That is, the insulation layer 470 simultaneously contacts the Schottky layer 460 and a portion of the capping layer 450 to secure the Schottky layer 460 on the capping layer 450, thereby improving reliability and yield of the UV detection element 400 by preventing the Schottky layer 460 from peeling due to stress upon wire bonding. In addition, the insulation layer 470 may be used as a protection layer with respect to external static electricity. The insulation layer 470 may include at least one of $SiN_x$ and $SiO_x$.

On the other hand, the UV detection element according to the exemplary embodiment may further include the first electrode 480 disposed on the Schottky layer 460 and the second electrode 490 disposed on the exposed region of the buffer layer 420.

The first electrode 480 may be formed in a region on the Schottky layer 460. The first electrode 480 may include a metal and may be composed of multiple layers. For example, the first electrode 480 may include a stacked structure of Ni/Au layers.

Since the region of the Schottky layer 460 in which the first electrode 480 is formed does not allow transmission of light therethrough and obstructs the functions of the Schottky layer 460, the first electrode 480 is preferably formed in a minimal region for wire bonding. According to the exemplary embodiment, the first electrode 480 is formed near one side of the Schottky layer 460 so as to face the second electrode 490 in a lateral direction. The first electrode 480 has a body 481 and a pair of branches 482 branched from the body 481 in opposite directions of the body 481 to secure uniform flow of electric current in the Schottky layer. Since variation of a response current value by ultraviolet light is large depending upon an optimal width of the Schottky layer, it is advantageous to maximize the width of the Schottky layer even in a device having the same size.

The second electrode 490 may form ohmic contact with the buffer layer 420 and may be composed of multiple layers including a metal. For example, the second electrode 490 may include a stacked structure of Ni/Au layers.

The second electrode 490 may be formed in an exposed region on the high temperature buffer layer 422, which is exposed by partially removing the capping layer 450, the light absorption layer 440, the low current blocking layer 430 and the ESD protection layer 423 by dry etching or the like. Here, the second electrode 490 and the high temperature buffer layer 422 are formed to have ohmic characteristics and a portion of the high temperature buffer layer 422 can also be removed by etching.

The second electrode 490 may be formed in a region on the high temperature buffer layer 422 so as to be separated from the first electrode 480 and may extend to a portion inside the center to secure uniform current flow, without being limited thereto.

Figure 19:
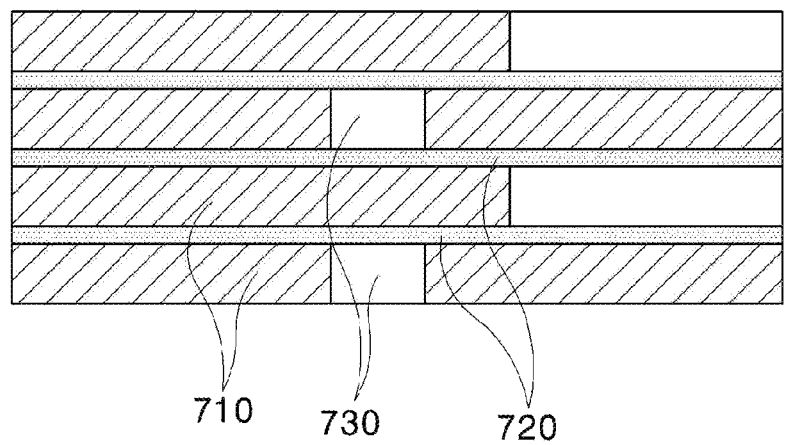
FIG. 19 is a cross-sectional view of a light blocking layer of an integrated circuit applied to the UV detector shown in FIG. 15.

FIG. 19 is a cross-sectional view of the light blocking layer of FIG. 15.

Referring to FIG. 19, the light blocking layer 700 is disposed over the entire upper surface of the integrated circuit 500 and may also be disposed in photoreactive regions, such as a silicon exposed region, an ADC block region not blocking external light, a pad periphery region, a sealing region, and the like.

The light blocking layer 700 blocks UV light having a wavelength of 400 nm or less, visible light having a wavelength of about 400 nm to 800 nm, IR light having a wavelength of a wavelength of about 800 nm to 1,100 nm from entering the integrated circuit 500, thereby preventing generation of a reaction current.

The light blocking layer 700 may include a plurality of metal layers 710. The plural metal layers 710 are stacked so as to be separated at predetermined intervals from each other and may be disposed at locations displaced from another metal layer 710 stacked at an upper or lower side of each of the metal layers 710 so as to prevent all fractions of incident light, particularly visible light and infrared light from passing therethrough. Alternatively, the plurality of metal layers 710 may be stacked at the same location and an opening 730 may be formed between the metal layers 710 to prevent short circuit with peripheral circuits of the integrated circuit 500. A material for the metal layers 710 is not particularly limited as long as the metal layers can block inflow of visible light and infrared light.

An insulation layer 720 may be interposed between the metal layers 710 to prevent electrical connection therebetween. The insulation layer 720 may be formed of, for example, a silicone resin, an epoxy resin, and the like.

According to exemplary embodiments, the UV detector may include: a gallium nitride-based UV detection element having at least one electrode; a silicon (Si) based integrated circuit having at least one pad electrically connected to the electrode to process an output signal from the UV detection element; a light blocking layer formed at one side of the integrated circuit to shield photoreactive regions; and a housing receiving the integrated circuit with the UV detection element mounted on the integrated circuit, and having a plurality of electrodes to be electrically connected to the pad of the integrated circuit. Thus, the UV detector can output a digital signal through detection of UV light while preventing all fractions of incident light from affecting an output signal from the UV detection element by blocking the incident light from affecting the integrated circuit, thereby improving detection accuracy in the UV wavelength band.

Figure 20:
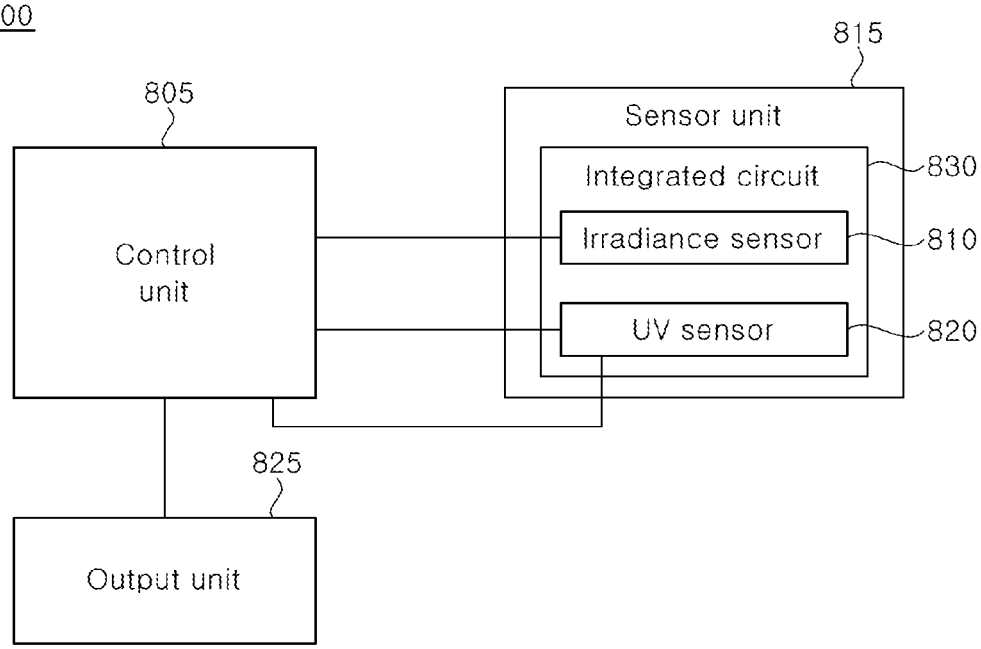
FIG. 20 is a schematic block diagram of a drive system of a UV index calculation device according to one exemplary embodiment of the present disclosure.

FIG. 20 is a schematic block diagram of a drive system of a UV index calculation device according to one exemplary embodiment of the present disclosure.

Referring to FIG. 20, the UV index calculation device 800 includes a control unit 805, a sensor unit 815, and an output unit 825. The sensor unit 815 includes an irradiance sensor 810, a UV sensor 820, and an integrated circuit 830.

The control unit 805 receives an irradiance signal from the irradiance sensor 810 and drives the UV sensor 820 when the irradiance sensed by the irradiance sensor 810 is higher than or equal to a predetermined irradiance. The control unit 805 receives a UV signal from the UV sensor 820, calculates a UV index and data according to the UV index, and transmits the data to the output unit 825.

In the sensor unit 815, the irradiance sensor 810 is formed on the integrated circuit 830 and transmits the generated irradiance signal to the integrated circuit 830. Then, the integrated circuit 830 receives and amplifies the received irradiance signal, and then transmits the amplified irradiance signal to the control unit 805.

When the UV sensor 820 of the sensor unit 815 is driven under control of the control unit 805, the UV sensor 820 generates a UV signal through detection of UV light and transmits the UV signal to the integrated circuit 830. Here, the integrated circuit 830 is bonded to the UV sensor 820 to receive and amplify the transmitted UV signal and transmit the amplified UV signal to the control unit 805.

The output unit 825 receives the data according to the UV index from the control unit 805 and displays the data in real time in the form of at least one of voice, vibration, color and text.

On the other hand, although the irradiance sensor 810 and the UV sensor 820 may be disposed on the integrated circuit 830 provided to the sensor unit 815 as described above, it should be understood that other implementations are also possible. Alternatively, the irradiance sensor 810 may be formed on a first integrated circuit and disposed in an irradiance sensor unit and the UV sensor 820 may be bonded to a second integrated circuit and disposed in a UV sensor unit. Hereinafter, exemplary embodiments of the present disclosure will be described in more detail.

Figure 21:
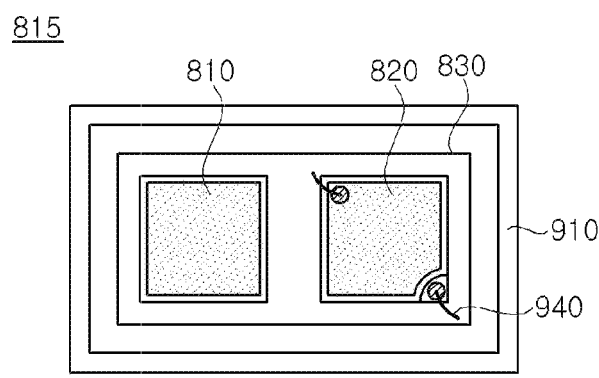
FIG. 21 is a schematic plan view of a sensor unit of the UV index calculation device according to the exemplary embodiment of the present disclosure.
Figure 22:
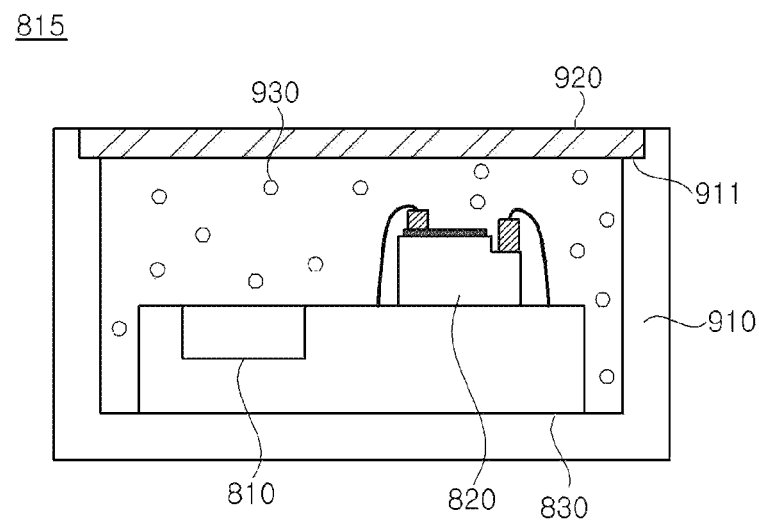
FIG. 22 is a schematic cross-sectional view of the sensor unit of the UV index calculation device according to the exemplary embodiment of the present disclosure.

FIG. 21 and FIG. 22 are a plan view and a cross-sectional view of the sensor unit of the UV index calculation device according to the exemplary embodiment of the present disclosure, respectively. Detailed descriptions of the components described above will be omitted for clarity.

Referring to FIG. 21 and FIG. 22, the sensor unit 815 may further include a body 910, a cover 920, and a molding portion 930. The sensor unit 815 may be realized in the form of a package, without being limited thereto.

The irradiance sensor 810 may be formed together with the integrated circuit 830. The UV sensor 820 may be bonded to an upper surface of the integrated circuit 830 after the integrated circuit 830 is mounted on the body 910. Alternatively, the UV sensor 820 may be bonded to the upper surface of integrated circuit 830 and then the integrated circuit 830 may be mounted on the body 910. The irradiance sensor 810 may be formed of a silicon-based semiconductor and the UV sensor 820 may be formed of a nitride-based semiconductor, without being limited thereto.

The body 910 may surround lower portions and side surfaces of the integrated circuit 830, the irradiance sensor 810 and the UV sensor 820. The body 910 may be formed of general plastic materials including polymers, such as acrylonitrile butadiene styrene (ABS), liquid crystal polymer (LCP), polyamide (PA), polyphenylene sulfide (IPS), or thermoplastic elastomers (TPE), metals, or ceramics. However, the material for the body 910 is not limited thereto and the body 910 may be formed of any material so long as the body 910 can support the irradiance sensor 810 and the UV sensor 820. In this case, the UV sensor 820 may be electrically connected to the body 910 through a bonding wire 940. In addition, the body 910 may further include terminals (not shown) through which the sensor unit 815 can be connected to the outside, and the terminals may be disposed on a side surface or a lower surface of the body 910. However, it should be understood that other implementations are also possible.

The cover 920 may be supported on an end portion 211 of the body 910 to be placed above the irradiance sensor 810 and the UV sensor 820. The cover 920 may be separated from the irradiance sensor 810 and the UV sensor 820 and may protect the irradiance sensor 810 and the UV sensor 820 from the outside. Further, the cover 920 may have light transmittance for transmitting incident light. The cover 920 may be formed of, for example, quartz, sapphire, a light transmitting polymer, a light transmitting ceramic material, or a light transmitting glass.

The molding portion 930 may be formed under the cover 920 to cover at least part of the irradiance sensor 810 and the UV sensor 820. Although the molding portion 930 has a flat shape in this exemplary embodiment, the shape of the molding portion 930 is not limited thereto. In addition, the molding portion 930 may be formed of a light transmitting molding material, without being limited thereto.

On the other hand, although the cover 920 and the molding portion 930 are disposed on the sensor unit 815 in this exemplary embodiment, it should be understood that other implementations are also possible. Alternatively, only the cover 920 or the molding portion 930 may be disposed on the sensor unit 815.

According to the exemplary embodiments, the irradiance sensor 810 and the UV sensor 820 are controlled by the control unit 805. Thus, the control unit 805 receives an irradiance signal from the irradiance sensor 810 and drives the UV sensor 820 when the irradiance is a predetermined irradiance or more. For example, the predetermined irradiance may be 10,000 lux or 12,000 lux and stored in the control unit 805. A user can preset an irradiance value allowing the control unit to drive the UV sensor 820. The output unit 825 may display data according to the calculated UV index from the control unit 805 in the form of at least one of sound, vibration, color and text. For example, the output unit 825 may be a display and thus inform a user of the display data according to the calculated UV index from the control unit 805 in real time without separate application operation.

According to the exemplary embodiments, the UV index calculation device can calculate the UV index through automatic detection of UV light and can display data according to the UV index by employing both the irradiance sensor 810 for detecting irradiance and generating an irradiance signal and the UV sensor 820 for detecting UV light and generating a UV signal.

Figure 23:
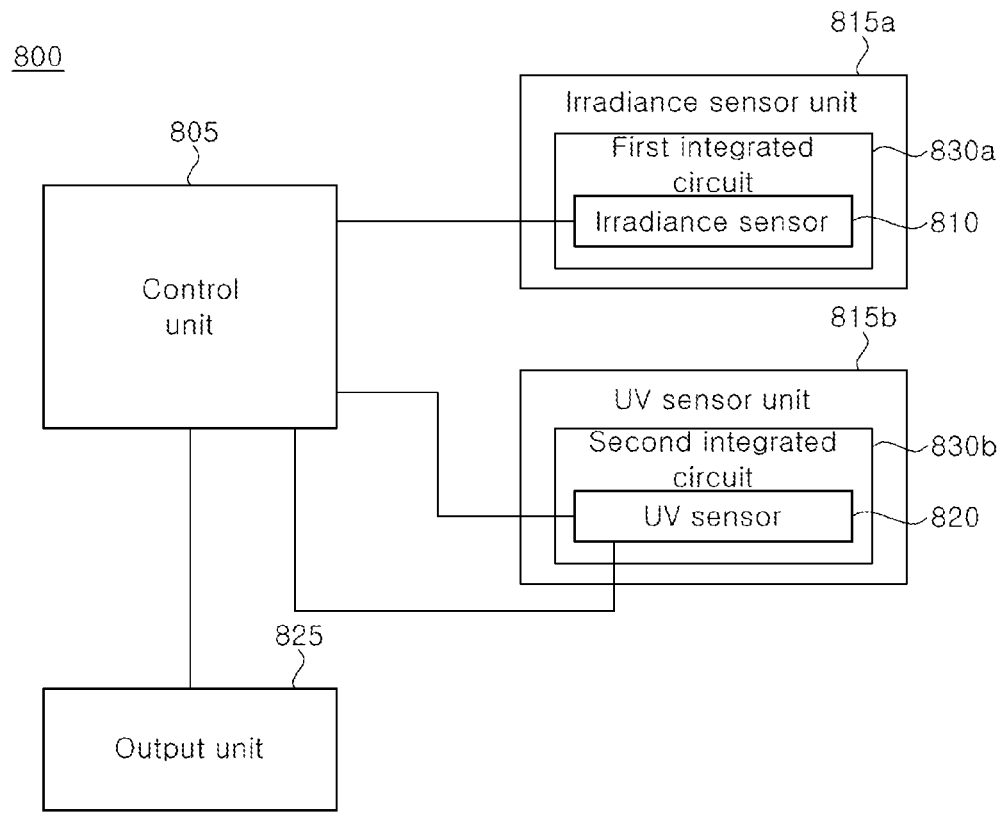
FIG. 23 is a schematic block diagram of a drive system of a UV index calculation device according to another exemplary embodiment of the present disclosure.

FIG. 23 is a schematic block diagram of a drive system of a UV index calculation device according to another exemplary embodiment of the present disclosure. Detailed descriptions of the components described above will be omitted for clarity.

Referring to FIG. 23, the UV index calculation device 800 includes a control unit 805, an irradiance sensor unit 115*a*, a UV sensor unit 115*b*, and an output unit 825, in which the irradiance sensor unit 815*a* includes an irradiance sensor 810 and a first integrated circuit 830*a*, and the UV sensor unit 815*b* includes a UV sensor 820 and a second integrated circuit 830*b*.

In the irradiance sensor unit 815*a*, the irradiance sensor 810 is formed on the first integrated circuit 830*a* and transmits an irradiance signal to the first integrated circuit 830*a*. Then, the first integrated circuit 830*a* amplifies the irradiance signal received from the irradiance sensor 810 and transmits the amplified irradiance signal to the control unit 805.

The UV sensor 820 of the UV sensor unit 815*b* is operated under control of the control unit 805, and generates a UV signal to transmit the UV signal to the second integrated circuit 830*b*. The second integrated circuit 830*b* is bonded to the UV sensor 820 to amplify the ultraviolet signal received from the UV sensor 820 and to transmit the amplified ultraviolet signal to the control unit 805.

According to the exemplary embodiments, the irradiance sensor 810 for detecting the irradiance and generating an irradiance signal is disposed in the irradiance sensor unit 815*a*, and the UV sensor 820 for detecting UV light and generating a UV signal is disposed in the UV sensor unit 815*b*. Accordingly, integrated circuits capable of efficiently generating a signal in response to light detected by each sensor can be separately arranged, thereby realizing a UV index calculation device having an automatic control function with high accuracy.

Figure 24:
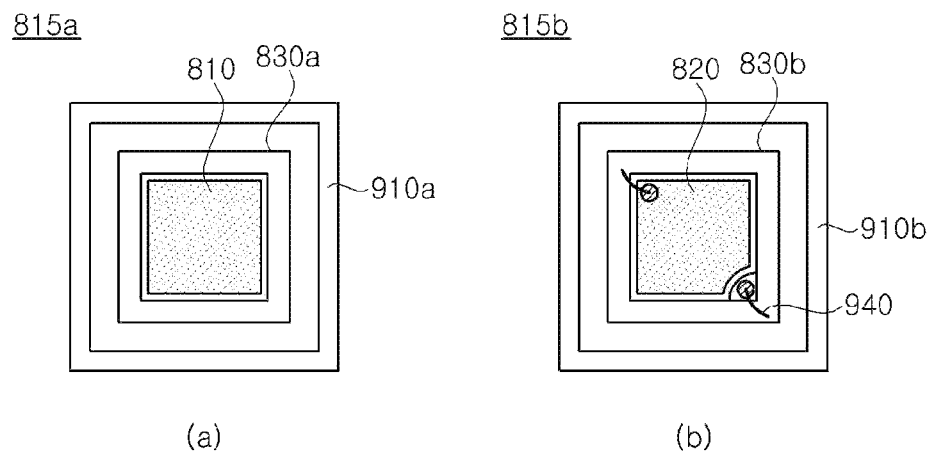
FIG. 24 is a schematic plan view of a sensor unit of the UV index calculation device according to another exemplary embodiment of the present disclosure.

FIG. 24 is a schematic plan view of a sensor unit of the UV index calculation device according to another exemplary embodiment of the present disclosure. Detailed descriptions of the components described above will be omitted for clarity.

Referring to FIG. 24, the irradiance sensor unit 815*a* may include an irradiance sensor 810, a first integrated circuit 830*a*, a first body 910*a*, a first cover, and a first molding portion (not shown). Likewise, the UV sensor unit 815*b* may include a UV sensor 820, a second integrated circuit 830*b*, a second body 910*b*, a second cover, and a second molding portion. Each of the irradiance sensor unit 815*a* and the UV sensor unit 815*b* may be implemented in package form, but is not limited thereto.

The irradiance sensor 810 is formed inside the first integrated circuit 830*a* upon formation of the first integrated circuit 830*a*. The first integrated circuit 830*a* is mounted on the first body 910*a* of the irradiance sensor unit 815*a*. The UV sensor 820 is bonded to an upper surface of the second integrated circuit 830*b* after the second integrated circuit 830*b* is mounted on the second body 910*b*. Alternatively, the UV sensor 820 may be mounted on the second integrated circuit 830*b* in advance and the second integrated circuit 1830*b* with the UV sensor 820 mounted thereon may be mounted on the second body 910*b*. The irradiance sensor 810 may be formed of a silicon-based semiconductor and the UV sensor 820 may be formed of a nitride-based semiconductor, without being limited thereto.

Figure 25:
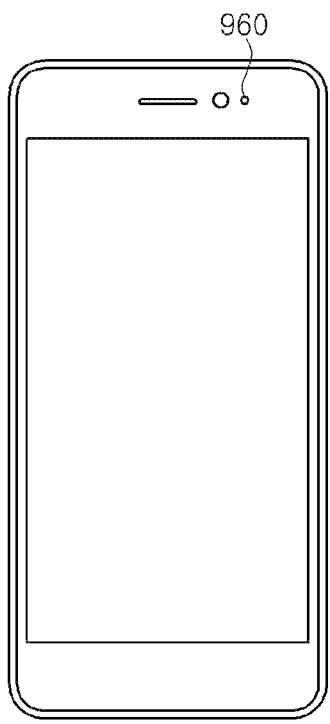
FIG. 25 is a plan view of a smartphone corresponding to the UV index calculation device according to various exemplary embodiments of the present disclosure.

FIG. 25 is a plan view of a smartphone corresponding to the UV index calculation device according to various exemplary embodiments of the present disclosure.

Referring to FIG. 25, a smartphone 950 may include a sensor unit 960. The sensor unit 960 may be implemented in package form and embedded in the smartphone 950 and a transparent window is disposed outside the smartphone 950 such that the sensor unit 960 can detect light. The sensor unit 960 may include an irradiance sensor (not shown) and a UV sensor (not shown) bonded to one integrated circuit (not shown), and may be disposed on a front surface of the smartphone 950. However, it should be understood that other implementations are also possible. Alternatively, an irradiance sensor unit and a UV sensor unit may be independently disposed on the front surface of the smartphone 950 or on the front and rear surfaces thereof.

According to the exemplary embodiments, with the sensor unit 960 embedded therein, the smartphone 950 can increase utilization of the UV index calculation device having an automatic control function using the irradiance sensor embedded in most smartphones.

Figure 26:
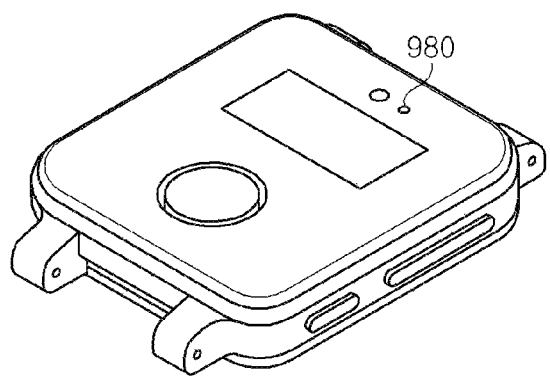
FIG. 26 is a perspective view of a smart watch corresponding to the UV index calculation device according to various exemplary embodiments of the present disclosure.

FIG. 26 is a perspective view of a smart watch corresponding to the UV index calculation device according to various exemplary embodiments of the present disclosure.

Referring to FIG. 26, a smart watch 970 may include a sensor unit 980. The sensor unit 980 may be implemented in package form and may be embedded in the smart watch 970 and a transparent window is disposed thereon such that the sensor unit 980 can detect light. The sensor unit 980 may include an irradiance sensor (not shown) and a UV sensor (not shown) mounted on one integrated circuit (not shown), and may be disposed on the smart watch 970. However, it should be understood that other implementations are also possible. Alternatively, the irradiance sensor and the UV sensor may be provided to an irradiance sensor unit and a UV sensor unit, respectively, which may be independently disposed on a front surface of the smart watch 970 or on the front and rear surfaces thereof.

According to the exemplary embodiments, with the UV index calculation device 800 embedded therein, the smart watch 970 can increase utilization of the UV index calculation device having an automatic control function using the irradiance sensor embedded in most smart watches, and can maximize the utilization of the UV index calculation device according to characteristics of the smart watch 970 worn by a user.

Although some exemplary embodiments have been described herein, it should be understood by those skilled in the art that these embodiments are given by way of illustration only, and that various modifications, variations, and alterations can be made without departing from the spirit and scope of the invention.

What is claimed is:

1. A UV measuring device comprising:
   a substrate;
   an electrode formed on the substrate;
   a read-out integrated circuit (ROIC) disposed inside the substrate and electrically connected to the electrode; and
   a UV sensor disposed on the read-out integrated circuit and including aluminum gallium nitride (AlGaN), the UV sensor electrically connected to the read-out integrated circuit and positioned on a growth substrate,
   wherein the read-out integrated circuit converts a photocurrent input from the UV sensor into a digital signal including UV data, and
   wherein the UV measuring device further includes:
   a memory unit electrically connected to the UV sensor and storing data of the UV sensor, and
   a processing unit electrically connected to the ROIC and the memory unit and matching values determined by the ROIC with the data stored in the memory unit.

2. The UV measuring device of claim 1, further comprising:
   a transparent window including transparent material and disposed to face the UV sensor to allow transmission of UV light through the transparent window.

3. The UV measuring device of claim 2, wherein the transparent window includes quartz.

4. The UV measuring device of claim 1, wherein the UV sensor is covered by a silicone material.

5. The UV measuring device of claim 1, wherein the UV sensor and the read-out integrated circuit are bonded to each other.

6. The UV measuring device of claim 1, wherein the UV sensor is disposed on a side surface of the read-out integrated circuit.

7. The UV measuring device of claim 1, wherein the UV sensor includes a UVB (Ultraviolet B) sensor.

8. The UV measuring device of claim 7, wherein a bonding area between the UV sensor and the read-out integrated circuit includes a highly thermally conductive bonding agent.

9. The UV measuring device of claim 7, wherein a bonding area between the UV sensor and the read-out integrated circuit includes an insulation bonding agent, and the UV sensor and the read-out integrated circuit are insulated by the growth substrate.

10. The UV measuring device of claim 1, further comprising:
    a display unit displaying UV data generated by the read-out integrated circuit.

11. The UV measuring device of claim 1, further comprising:
    an UVA (Ultraviolet A) sensor including an indium gallium nitride (InGaN) or gallium nitride (GaN),
    wherein the UVA sensor is bonded to the read-out integrated circuit.

12. The UV measuring device of claim 11, further comprising:
    an UVC sensor including an aluminum gallium nitride (AlGaN),
    wherein the UVC sensor is bonded to the read-out integrated circuit.

13. The UV measuring device of claim 12, wherein data obtained through the UVA sensor or the UVC sensor are used as supplemental data for improvement of accuracy in conversion of data obtained through the UVB sensor into UV data in the read-out integrated circuit.

14. The UV measuring device of claim 1, wherein the UV data comprises at least one of UV quantity data, UV index data, vitamin D synthesis data, or safety/danger notice data.

15. The UV measuring device of claim 1, wherein the read-out integrated circuit comprises a cavity formed on a different region of the read-out integrated circuit from a region where the UV sensor is disposed.

16. The UV measuring device of claim 1, wherein the read-out integrated circuit comprises a heat pipe including a highly thermal conductive material and disposed under the UV sensor inside.

17. A portable digital assistant comprising a power supply, a processor, a memory, and a display unit, the portable digital assistant further comprising:
    a substrate;
    an electrode formed on the substrate;
    a read-out integrated circuit (ROTC) disposed inside the substrate and electrically connected to the electrode; and
    a UV sensor disposed on the read-out integrated circuit and including an aluminum gallium nitride (AlGaN), the UV sensor electrically connected to the read-out integrated circuit and formed on a growth substrate, and
    wherein the read-out integrated circuit converts photocurrent input from the UV sensor into a digital signal including UV data, and
    wherein UV data generated by the read-out integrated circuit is displayed through the display unit, and
    wherein the portable digital assistant further includes:
    a memory unit electrically connected to the UV sensor and storing data of the UV sensor; and
    a processing unit electrically connected to the ROIC and the memory unit and matching values determined by the ROIC with the data stored in the memory unit.

18. A photodetector comprising:
    a plurality of semiconductor photodetection chips exhibiting peak response at different wavelengths, each of the plurality of semiconductor photodetection chips receiving incident light and generating electric current in response to the received light;
    a read-out integrated circuit (ROIC) electrically connected to the plurality of semiconductor photodetection chips and determining current values generated from the plurality of semiconductor photodetection chips;
    a memory unit electrically connected to the plurality of semiconductor photodetection chips and storing wavelength response data of each of the plurality of semiconductor photodetection chips; and
    a processing unit electrically connected to the read-out integrated circuit and the memory unit and matching the current values determined by the ROIC with the wavelength response data stored in the memory unit.

19. The photodetector of claim 18, wherein the processing unit determines a wavelength of the incident light by matching the current values determined by the ROIC with the wavelength response data stored in the memory unit.

20. The photodetector of claim 19, further comprising:
an output unit electrically connected to the processing unit and receiving wavelength data of the incident light from the processing unit and outputting the wavelength data.

21. The photodetector of claim 18, further comprising:
a substrate on which the plurality of semiconductor photodetection chips is disposed.

22. The photodetector of claim 21, wherein the plurality of semiconductor photodetection chips are separated at constant intervals from each other on the substrate.

23. The photodetector of claim 21, wherein the ROIC, the memory unit and the processing unit are disposed on the substrate.

24. The photodetector of claim 23, wherein the substrate further comprises an output unit electrically connected to the processing unit and receiving wavelength data of the incident light from the processing unit and outputting the wavelength data.

25. The photodetector of claim 21, wherein the ROIC, the memory unit and the processing unit are disposed outside the substrate.

26. The photodetector of claim 21, further comprising:
a sidewall disposed on the substrate and surrounding side surfaces of the plurality of semiconductor photodetection chips.

27. The photodetector of claim 18, wherein the plurality of semiconductor photodetection chips comprise first to ninth semiconductor photodetection chips separated from one another, and
the first to ninth semiconductor photodetection chips exhibiting peak responses to first to ninth wavelengths of light.

28. The photodetector of claim 27, wherein the first to ninth wavelengths are sequentially decreasing from the first wavelength to the ninth wavelength by a constant value.

29. A photodetector comprising:
a substrate; and
a plurality of semiconductor photodetection chips disposed on the substrate and exhibiting peak response at different wavelengths, each of the plurality of semiconductor photodetection chips receiving incident light and generating electric current in response to the received incident light;
a read-out integrated circuit (ROIC) disposed on the substrate and electrically connected to the plurality of semiconductor photodetection chips and determining current values generated from the plurality of semiconductor photodetection chips, wherein the photodetector further comprises:
a memory unit electrically connected to the plurality of semiconductor photodetection chips and storing wavelength response data of each of the plurality of semiconductor photodetection chips; and
a processing unit electrically connected to the read-out integrated circuit and the memory unit and matching the current values determined by the ROIC with the wavelength response data stored in the memory unit, and
wherein the processing unit determines a wavelength of the incident light by matching the current values determined by the ROIC with the wavelength response degree data stored in the memory unit.

30. An electronic device determining a wavelength of incident light entering a photodetector, the photodetector comprising:
a plurality of semiconductor photodetection chips exhibiting peak response at different wavelengths, each of the plurality of semiconductor photodetection chips receiving incident light and generating electric current in response to the received light;
a read-out integrated circuit (ROIC) electrically connected to the plurality of semiconductor photodetection chips and determining current values generated from the plurality of semiconductor photodetection chips;
a memory unit electrically connected to the plurality of semiconductor photodetection chips and storing wavelength response data of each of the plurality of semiconductor photodetection chips; and
a processing unit electrically connected to the read-out integrated circuit and the memory unit and matching the current values determined by the ROIC with the wavelength response data stored in the memory unit.

31. The electronic device of claim 30, wherein the processing unit determines a wavelength of the incident light by matching the current values determined by the ROIC with the wavelength response data stored in the memory unit.

32. The electronic device of claim 31, further comprising:
an output unit electrically connected to the processing unit and receiving wavelength data of the incident light from the processing unit and outputting the wavelength data.

33. The electronic device of claim 32, further comprising:
a display unit displaying the wavelength data outputted from the output unit.

34. A UV detector comprising:
an UV detection element comprising an electrode and including a gallium nitride;
an integrated circuit comprising a pad electrically connected to the electrode to process an output signal of the UV detection element and including a silicon (Si), the integrated circuit accommodating the UV detection element on an upper surface of the integrated circuit;
a light blocking layer formed on one side of the integrated circuit and shielding a photoreactive region of the integrated circuit; and
a housing accommodating the integrated circuit and comprising a plurality of electrodes electrically connected to the pad of the integrated circuit, wherein the light blocking layer comprises a plurality of metal layers.

35. The UV detector of claim 34, further comprising: a sapphire substrate on which the UV detection element is disposed, the UV detection element being insulated from the integrated circuit by the sapphire substrate bonded on the integrated circuit.

36. The UV detector of claim 34, wherein the plurality of metal layers are disposed at different locations such that each metal layer is displaced from other adjacent metal layer disposed.

37. The UV detector of claim 34, wherein the light blocking layer further comprises an insulation layer interposed between the plurality of metal layers.

38. The UV detector of claim 34, further comprising:
a ground pad disposed inside the integrated circuit and structured to protect the electrode of the UV detection element from electrostatic discharge.

39. The UV detector of claim 34 wherein the housing comprises a window including a transparent material and disposed to face the UV detection element.

40. The UV detector of claim 39, wherein the window includes quartz.

41. The UV detector of claim 34, wherein the housing includes a filler inside of the housing.

42. The UV detector of claim 41, wherein the filler includes a transparent silicone material allowing transmission of UV light therethrough.

43. A UV detector comprising:
an UV detection element comprising an electrode and including a gallium nitride;
an integrated circuit comprising a pad electrically connected to the electrode to process an output signal of the UV detection element and including a silicon (Si), the integrated circuit accommodating the UV detection element on an upper surface of the integrated circuit;
a light blocking layer formed on one side of the integrated circuit and shielding a photoreactive region of the integrated circuit; and
a housing accommodating the integrated circuit and comprising a plurality of electrodes electrically connected to the pad of the integrated circuit, wherein the UV detector further comprises: an analog digital converter (ADC) block region converting an analog signal output from the UV detection element into a digital signal, a pad periphery region electrically connected to the electrode of the UV detection element and the electrodes of the housing, and a sealing region formed along a periphery of the integrated circuit, and wherein the light blocking layer is disposed in the analog digital converter block region, the pad periphery region, and the sealing region.

* * * * *